US012765349B2

(12) United States Patent
Jao

(10) Patent No.: US 12,765,349 B2
(45) Date of Patent: Oct. 13, 2026

(54) SEMICONDUCTOR DEVICE STRUCTURE INCLUDING A VERTICAL FUSE STRUCTURE

(71) Applicant: NANYA TECHNOLOGY CORPORATION, New Taipei City (TW)

(72) Inventor: Jui-Hsiu Jao, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 350 days.

(21) Appl. No.: 18/619,520

(22) Filed: Mar. 28, 2024

(65) Prior Publication Data

US 2025/0309054 A1 Oct. 2, 2025

(51) Int. Cl.
*H10W 20/20* (2026.01)
*H10W 20/00* (2026.01)
(Continued)

(52) U.S. Cl.
CPC ......... *H10W 20/20* (2026.01); *H10W 20/023* (2026.01); *H10W 20/493* (2026.01); *H10W 72/07254* (2026.01); *H10W 72/244* (2026.01); *H10W 72/247* (2026.01); *H10W 72/252* (2026.01); *H10W 90/724* (2026.01)

(58) Field of Classification Search
CPC . H10W 20/20; H10W 20/493; H10W 20/023; H10W 72/07254; H10W 90/724; H10W 72/247; H10W 72/244; H10W 72/252
See application file for complete search history.

(56) References Cited

U.S. PATENT DOCUMENTS 10,446,488 B1 * 10/2019 Sherrima ............ H10W 20/493
2018/0323202 A1 * 11/2018 Cheng ................. H10W 20/493
(Continued)

FOREIGN PATENT DOCUMENTS

CN 114864584 B * 3/2025 .......... H10W 20/491
TW 202006932 A 2/2020
TW 202125775 A 7/2021

OTHER PUBLICATIONS

Office Action and and the search report mailed on Apr. 22, 2025 related to Taiwanese Application No. 113124246.
(Continued)

*Primary Examiner* — Christine A Enad
(74) *Attorney, Agent, or Firm* — Xuan Zhang

(57) ABSTRACT

A semiconductor device structure and a method of manufacturing the same are provided. The semiconductor device structure includes a semiconductor substrate, a fuse structure, and a circuit region. The semiconductor substrate has a first surface and a second surface opposite to the first surface. The fuse structure is at least partially disposed within the semiconductor substrate. The circuit region is electrically connected to the fuse element. The fuse structure includes a first fuse element, a second fuse element, and a fuse medium connecting the first fuse element and the second fuse element. The first fuse element, the second fuse element, and the fuse medium are arranged along a first direction from the first surface toward the second surface of the semiconductor substrate.

12 Claims, 27 Drawing Sheets

(51) Int. Cl.

| | |
|---|---|
| ***H10W 20/49*** | (2026.01) |
| ***H10W 72/00*** | (2026.01) |
| ***H10W 72/20*** | (2026.01) |
| ***H10W 90/00*** | (2026.01) |

(56) References Cited

U.S. PATENT DOCUMENTS

| | | | | |
|---|---|---|---|---|
| 2020/0402832 | A1 | 12/2020 | Santos Rodriguez et al. | |
| 2022/0246625 | A1* | 8/2022 | Li | H10B 20/25 |
| 2023/0102669 | A1 | 3/2023 | Gong et al. | |
| 2023/0309296 | A1 | 9/2023 | Liu et al. | |
| 2024/0047348 | A1 | 2/2024 | Chen et al. | |
| 2024/0063116 | A1* | 2/2024 | Li | H10W 20/493 |

OTHER PUBLICATIONS

Office Action and and the search report mailed on May 6, 2025 related to Taiwanese Application No. 114109664.

Summary translation of Office Action and and the search report mailed on Apr. 22, 2025 related to Taiwanese Application No. 113124246 and Summary translation of Office Action and and the search report mailed on May 6, 2025 related to Taiwanese Application No. 114109664.

* cited by examiner

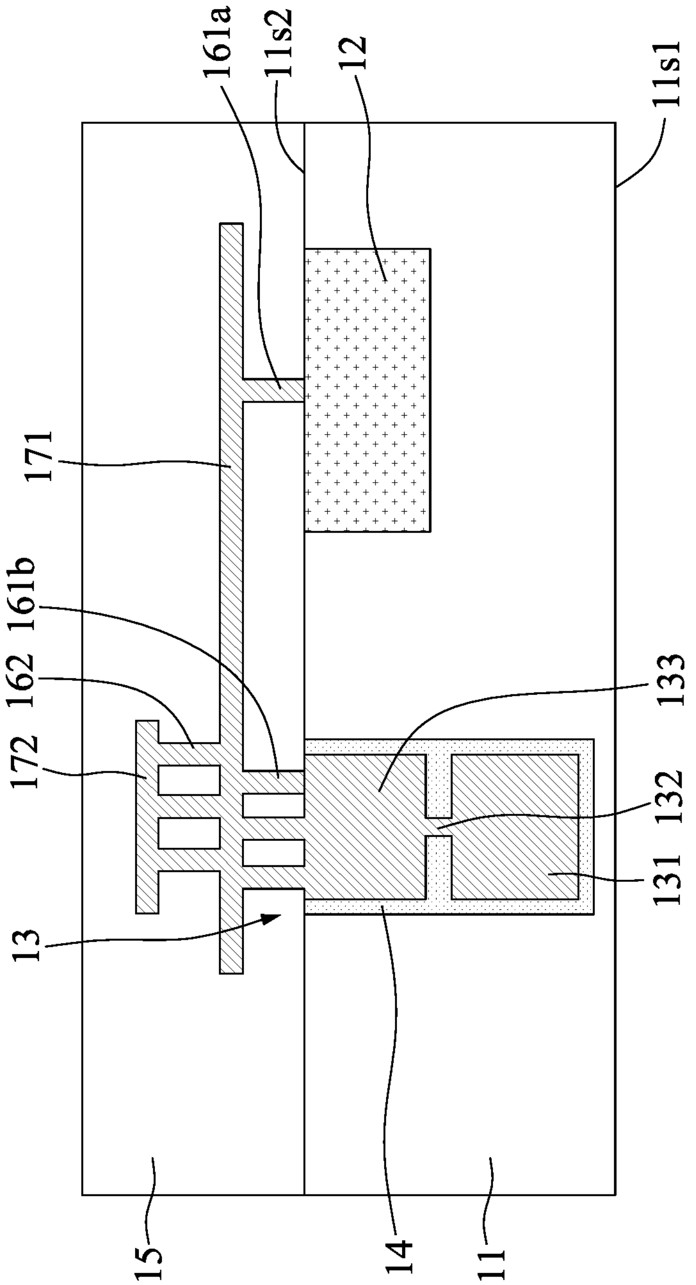
FIG. 8H
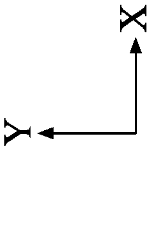

500

SEMICONDUCTOR DEVICE STRUCTURE INCLUDING A VERTICAL FUSE STRUCTURE

TECHNICAL FIELD

The present disclosure relates to a semiconductor device structure, and more particularly to a semiconductor device structure having a vertical fuse structure.

DISCUSSION OF THE BACKGROUND

Fuses and e-fuses are commonly used in memory elements to convert a redundant memory cell to a normal memory cell. A test circuit is utilized to determine the status of the fuse (i.e., whether the fuse is blown), such that the corresponding memory cell can be identified as a normal memory cell or a redundant memory cell. As technology develops, the size of the memory cell of semiconductor device structures decreases. Since the size of each component in a semiconductor device structure cannot be reduced without limit, it is crucial to find other approaches to reduce the size of semiconductor device structures.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device structure. The semiconductor device structure includes a semiconductor substrate, a fuse structure, and a circuit region. The semiconductor substrate has a first surface and a second surface opposite to the first surface. The fuse structure is at least partially disposed within the semiconductor substrate. The circuit region is electrically connected to the fuse element. The fuse element includes a first fuse element, a second fuse element, and a fuse medium connecting the first fuse element and the second fuse element. The first fuse element, the second fuse element, and the fuse medium are arranged along a first direction from the first surface toward the second surface of the semiconductor substrate.

Another aspect of the present disclosure provides a semiconductor device structure. The semiconductor device structure includes a semiconductor substrate, a fuse structure, and a circuit region. The semiconductor substrate has a first surface and a second surface opposite to the first surface. The fuse structure penetrates the semiconductor substrate from the first surface to the second surface of the semiconductor substrate. The circuit region electrically connected to the fuse element.

Another aspect of the present disclosure provides a method of manufacturing a semiconductor device structure. The method includes: providing a semiconductor substrate having a first surface and a second surface opposite to the first surface; forming a fuse structure within the semiconductor substrate; and forming a circuit region within the semiconductor substrate, wherein the circuit region is electrically connected to the fuse structure.

The semiconductor device structure includes a vertical fuse structure which penetrates a semiconductor substrate.

The processes for producing the fuse structure can be integrated with those for defining the routing path (e.g., vias and metal layers) over the semiconductor substrate. The power consumption of a device can be improved without additional costs.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It can also be appreciated by those skilled in the art that such equivalent constructions do not depart from the spirit and scope of the disclosure as set forth in the appended claims.

BRIEF DESCRIPTION OF THE DRA WINGS

A more complete understanding of the present disclosure may be derived by referring to the detailed description and claims when considered in connection with the Figures, where like reference numbers refer to similar elements throughout the Figures, and:

FIG. 8H illustrates one or more stages of an exemplary method for manufacturing a semiconductor device structure according to some embodiments of the present disclosure.

DETAILED DESCRIPTION

Figure 1A:
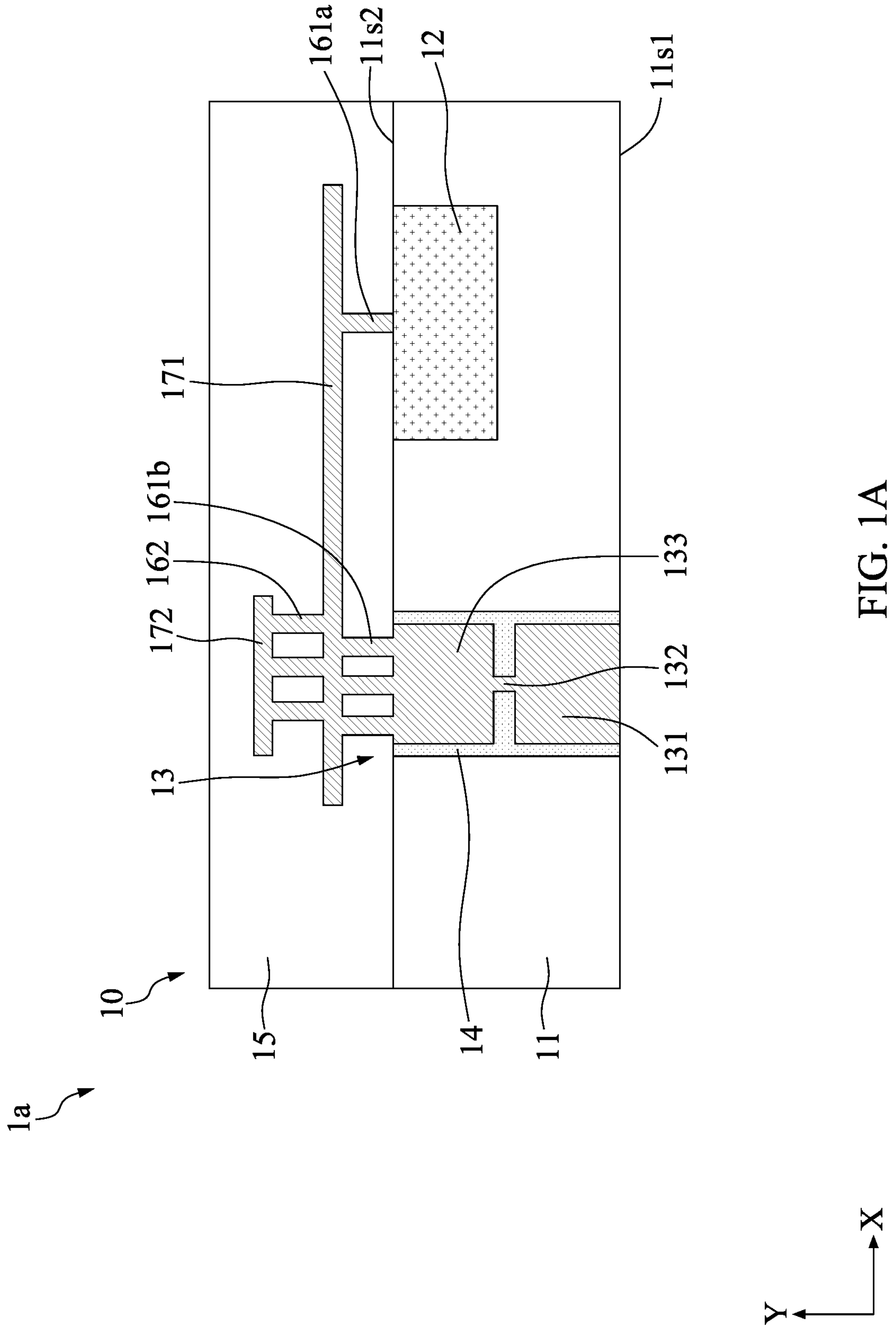
FIG. 1A illustrates a cross-sectional view of a semiconductor device structure, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

FIG. 1A illustrates a cross-sectional view of a semiconductor device structure 1*a*, in accordance with some embodiments of the present disclosure.

FIG. 1A illustrates a cross-sectional view of a semiconductor device structure 1*a*, in accordance with some embodiments of the present disclosure. In some embodiments, the semiconductor device structure 1*a* may include an electronic component 10. The electronic component 10 may include a semiconductor die or a chip. The electronic component 10 may include a substrate 11, a circuit region 12, a fuse structure 13, and a buffer layer 14.

The substrate 11 may include a semiconductor substrate, such as bulk semiconductor, a semiconductor-on-insulator (SOI) substrate, or the like. The substrate 11 may include an elementary semiconductor including silicon or germanium in a single crystal form, a polycrystalline form, or an amorphous form, a compound semiconductor material including at least one of silicon carbide, gallium arsenide, gallium phosphide, indium phosphide, indium arsenide, and indium antimonide, an alloy semiconductor material including at least one of SiGe, GaAsP, AlInAs, AlGaAs, GaInAs, GaInP, and GaInAsP, any other suitable material, or a combination thereof. In some embodiments, the alloy semiconductor substrate may include a SiGe alloy with a gradient Ge feature in which the Si and Ge composition changes from one ratio at one location to another ratio with location of the feature. In another embodiment, the SiGe alloy is formed over a silicon substrate. In some embodiments, a SiGe alloy may be mechanically strained by another material in contact with the SiGe alloy. In some embodiments, the substrate 11 may have a multilayer structure. It should be noted that some doped regions, isolation structures, and/or other features may be formed within the semiconductor carrier. The substrate 11 may have a surface 11_s_1 (or a lower surface) and a surface 11_s_2 (or an upper surface) opposite to the surface 11_s_1.

The circuit region 12 may include one or more integrated circuits. The circuit region 12 may be formed within the substrate 11. In some embodiments, the circuit region 12 may be electrically connected to the fuse structure 13. The circuit region 12 may be configured to control the short and/or open state of the fuse structure 13. Further, the circuit region 12 may include other ICs for application processor (AP), central processing unit (CPU), graphics processing unit (GPU), dynamic random access memory (DRAM), static random access memory (SRAM), power management, or other purposes.

In some embodiments, the fuse structure 13 may be at least partially disposed within the substrate 11. The fuse structure 13 may include a fuse or an anti-fuse. The fuse structure 13 may include a first terminal and a second terminal on which different voltages (or power) are imposed on. The first terminal and the second terminal may be connected by a fuse medium (or a fuse link). Application of a programming current to the fuse structure 13 destroys the fuse medium, thus changing the resistivity of the fuse structure 13. The fuse state (i.e., whether it has been programmed) can be read using a sensing circuit. The fuse structure 13 may include a fuse element 131 (or a first terminal), a fuse medium 132 (or a fuse link), and a fuse element 133 (or a second terminal). In some embodiments, each of the fuse element 131, the fuse medium 132, and the fuse element 133 may include copper, tungsten, ruthenium, iridium, nickel, osmium, rhodium, aluminum, molybdenum, cobalt, tantalum, alloys thereof, polysilicon, and combinations thereof.

Figure 1B:
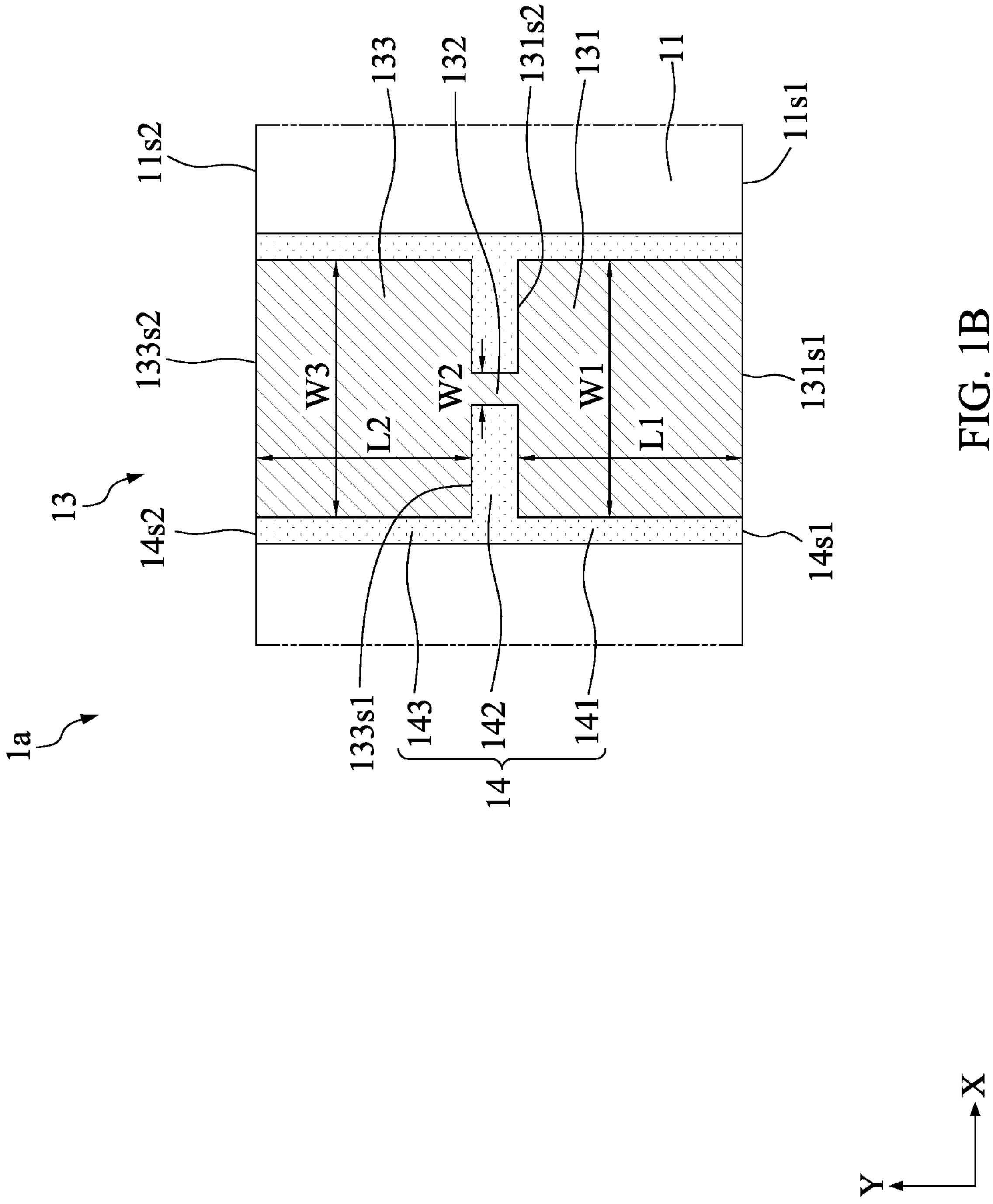
FIG. 1B illustrates an enlarged view of the semiconductor device structure as shown in FIG. 1A, in accordance with some embodiments of the present disclosure.

Referring to FIG. 1B, which illustrates an enlarged view of the semiconductor device structure as shown in FIG. 1A. In some embodiments, the fuse element 131 may be disposed within the substrate 11. The fuse element 131 may be electrically connected to a power supply which has a relatively low voltage. The fuse element 131 may have a surface 131_s_1 (or a lower surface) and a surface 131_s_2 (or an upper surface) opposite to the surface 131_s_1. In some embodiments, the surface 131_s_1 of the fuse element 131 may be substantially aligned with the surface 11_s_1 of the substrate 11. In some embodiments, the surface 131_s_1 of the fuse element 131 may be exposed by the substrate 11.

The fuse medium 132 may be disposed on or over the fuse element 131. In some embodiments, the fuse medium 132 may be disposed within the substrate 11. The fuse medium 132 may be disposed between the fuse elements 131 and 133 along the Y direction.

In some embodiments, the fuse element 133 may be disposed within the substrate 11. The fuse element 133 may be disposed on or over the fuse medium 132. In some embodiments, the fuse element 131, fuse medium 132, and fuse element 133 may be arranged along the Y direction. The fuse element 133 may be electrically connected to a power supply which has a relatively high voltage. The fuse element 133 may have a surface 133_s_1 (or a lower surface) connected to the fuse medium 132 and a surface 133_s_2 (or an upper surface) opposite to the surface 133_s_1. In some embodiments, the surface 133_s_2 of the fuse element 133 may be substantially aligned with the surface 11_s_2 of the substrate 11. In some embodiments, the surface 133_s_2 of the fuse element 133 may be exposed by the substrate 11.

The fuse element 131 may have a dimension (e.g., width) W1 along the X direction. The fuse medium 132 may have a dimension (e.g., width) W2 along the X direction. The fuse element 133 may have a dimension (e.g., width) W3 along the X direction. In some embodiments, the dimension W1 may be substantially equal to the dimension W3. In some embodiments, the dimension W1 may be greater than the dimension W2. The fuse element 131 may have a dimension (e.g., length) L1 along the Y direction. The fuse element 133 may have a dimension (e.g., length) L2 along the Y direction. In some embodiments, the dimension L1 may be substantially equal to the dimension L2.

In some embodiments, the buffer layer 14 may be embedded within the substrate 11. The buffer layer 14 may be disposed between the substrate 11 and the fuse structure 13. The fuse structure 13 may be spaced apart from the substrate 11 by the buffer layer 14. The buffer layer 14 may include a dielectric material, such as silicon oxide, silicon nitride, silicon oxynitride, other suitable dielectric materials, or combinations thereof. The buffer layer 14 may include a portion 141 abutting the fuse element 131, a portion 142 abutting the fuse medium 132, and a portion 143 abutting the fuse element 133. The portions 141, 142, and 143 may define a T-shaped profile in a cross-sectional view. The buffer layer 14 may have a surface 14_s_1 (or a lower surface) and a surface 14_s_2 (or an upper surface) opposite to the surface 14_s_1. In some embodiments, the surface 14_s_1 of the buffer layer 14 may be substantially aligned with the surface 131_s_1 of the fuse element 131. In some embodiments, the surface 14_s_1 of the buffer layer 14 may be substantially aligned with the surface 11_s_1 of the substrate 11. In some embodiments, the surface 14_s_2 of the buffer layer 14 may be substantially aligned with the surface 133_s_2 of the fuse element 131. In some embodiments, the surface 14_s_2 of the buffer layer 14 may be substantially aligned with the surface 11_s_2 of the substrate 11.

Referring back to FIG. 1A, the electronic component 10 may include a dielectric structure 15. The dielectric structure 15 may be disposed on or over the surface 11_s_2 of the substrate 11. The dielectric structure 15 may include silicon-oxide based materials such as tetra ethyl ortho silicate (TEOS) oxide, plasma-enhanced CVD (PECVD) oxide ($SiO_2$), phospho-silicate glass (PSG), boron-silicate glass (BSG), boron-doped phospho-silicate glass (BPSG), or other suitable materials. The dielectric structure 15 may also be referred to an interlayer dielectric. The dielectric structure 15 may include a multi-layered structure.

The electronic component 10 may include conductive vias 161_a_, 161_b_, and 162, as well as conductive layers 171 and 172 within the dielectric structure 15. Each of the conductive vias 161_a_, 161_b_, and 162, as well as conductive layers 171 and 172 may include copper, tungsten, ruthenium, iridium, nickel, osmium, rhodium, aluminum, molybdenum, cobalt, tantalum, alloys thereof, and combinations thereof.

The conductive via 161_a_ may be disposed between and electrically connect the circuit region 12 and conductive layer 171.

The conductive via 161_b_ may be disposed between and electrically connect the fuse structure 13 and conductive layer 171. The conductive via 161_b_ may be located at an elevation substantially the same as that of the conductive via 161_a_.

The conductive layer 171 may be disposed on or over the conductive vias 161_a_ and 161_b_.

The conductive via 162 may be disposed between and electrically connect the conductive layer 171 and conductive layer 172.

The conductive layer 172 may be disposed on or over the conductive via 162. It should be noted the electronic component 10 may include other conductive traces and/or vias for routing. For example, the electronic component 10 may include conductive traces and/or vias over the conductive layer 172, which may be connected to pads adjacent to the upper surface of the dielectric structure 15.

The semiconductor device structure 1*a* includes a vertical fuse structure (e.g., the fuse structure 13) which penetrates the substrate 11. The fuse structure 13 may be produced with a greater density without additional volume, which may be enhance the performance of the semiconductor device structure 1*a*.

Figure 2:
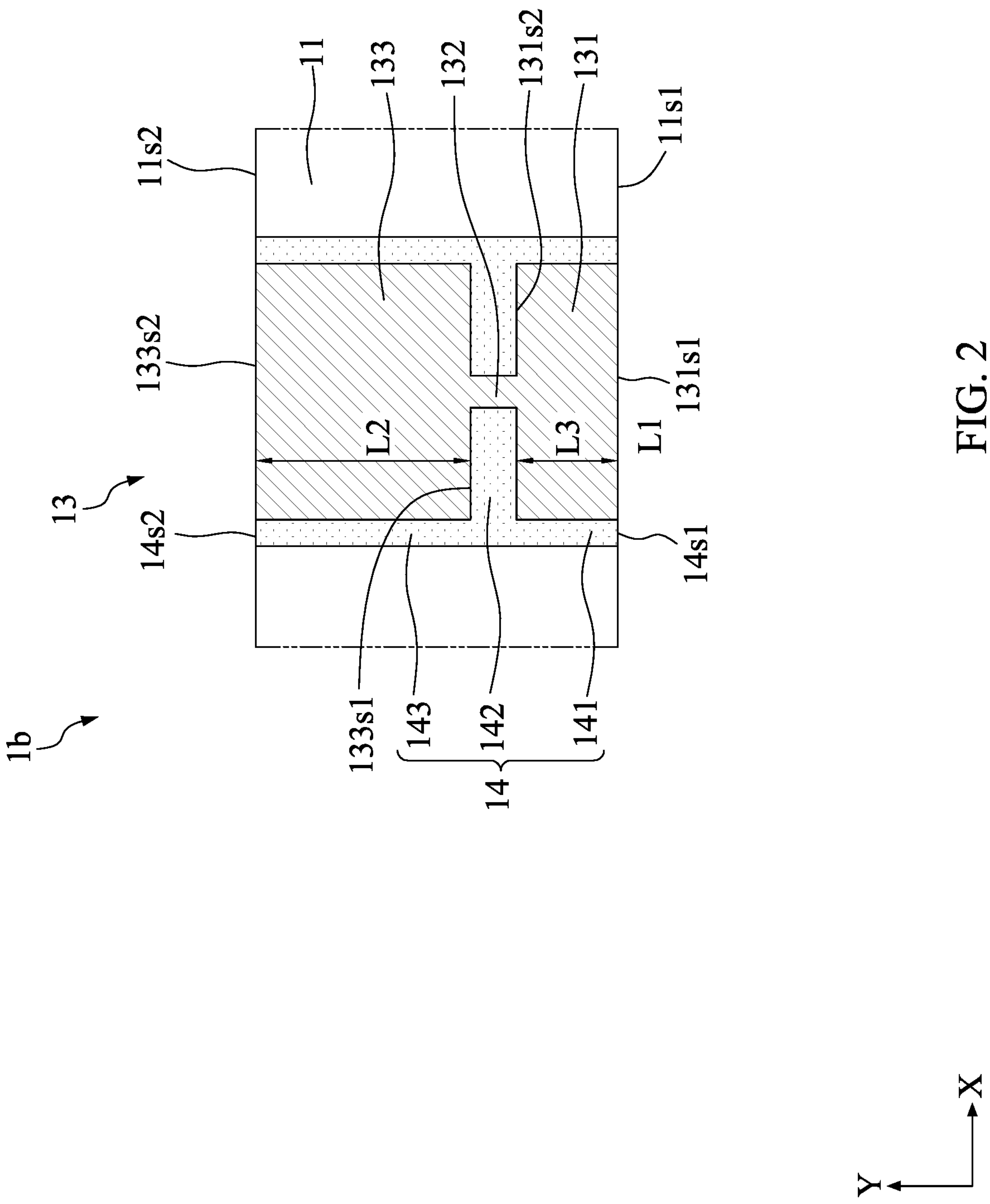
FIG. 2 illustrates a cross-sectional view of a semiconductor device structure, in accordance with some embodiments of the present disclosure.

FIG. 2 illustrates a cross-sectional view of a semiconductor device structure 1*b*, in accordance with some embodiments of the present disclosure. The semiconductor device structure 1*b* may be similar to the semiconductor device structure 1*a* as shown in FIG. 1A, and the differences between them are described as follows.

In some embodiments, the fuse element 131 may have a dimension (e.g., length) L3 along the Y direction. In some embodiments, the dimension L3 of the fuse element 131 may be different from the dimension L2 of the fuse element 133. In some embodiments, the dimension L3 of the fuse element 131 may be less than the dimension L2 of the fuse element 133.

Figure 3:
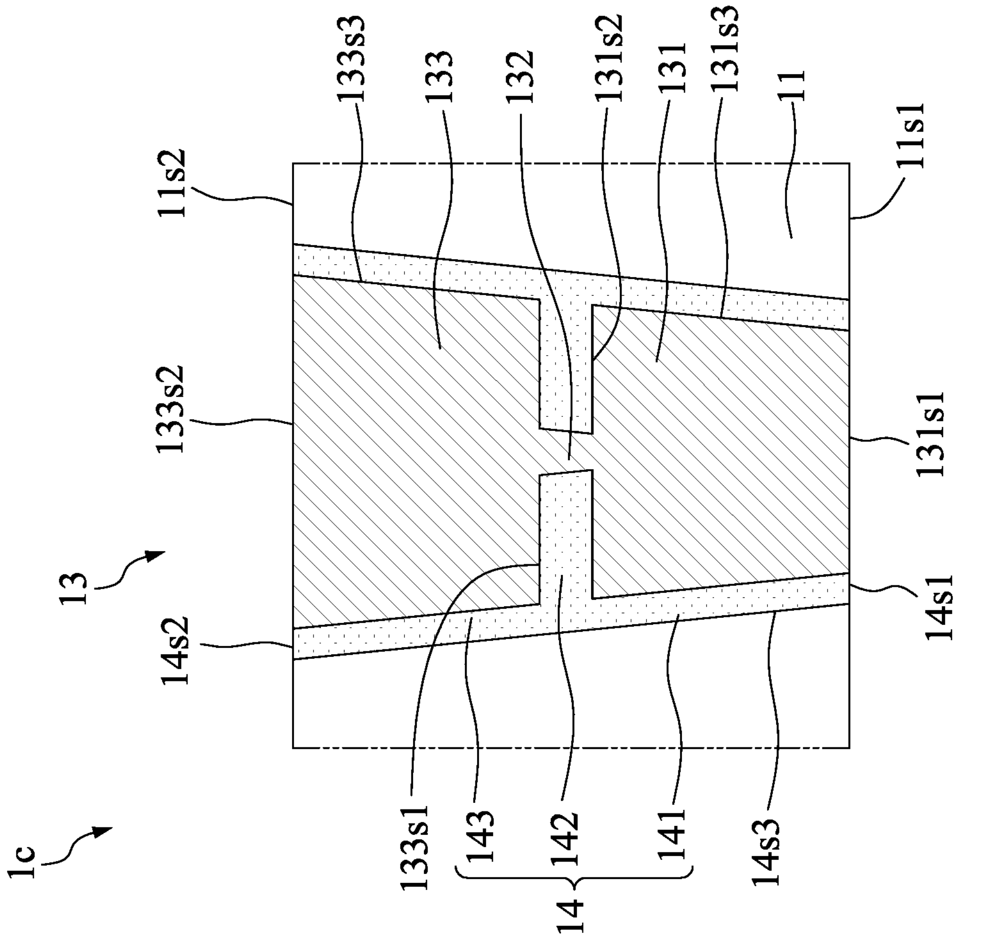
FIG. 3 illustrates a cross-sectional view of a semiconductor device structure, in accordance with some embodiments of the present disclosure.

FIG. 3 illustrates a cross-sectional view of a semiconductor device structure 1*c*, in accordance with some embodiments of the present disclosure. The semiconductor device structure 1*c* may be similar to the semiconductor device structure 1*a* as shown in FIG. 1A, and the differences between them are described as follows.

The buffer layer 14 may have a surface 14*s*3 (or a lateral surface) extending between the surfaces 14*s*1 and 14*s*2. In some embodiments, the surface 14*s*3 may be slanted with respect to the surface 11*s*1. The fuse element 131 may have a surface 131*s*3 (or a lateral surface) extending between the surfaces 131*s*1 and 131*s*2. In some embodiments, the surface 131*s*3 may be slanted with respect to the surface 11*s*1. The fuse element 133 may have a surface 133*s*3 (or a lateral surface) extending between the surfaces 133*s*1 and 133*s*2. In some embodiments, the surface 133*s*3 may be slanted with respect to the surface 11*s*2.

In some embodiments, the fuse element 131 may be tapered toward the surface 11*s*1 of the substrate 11. In some embodiments, the fuse element 133 may be tapered toward the surface 11*s*1 of the substrate 11. In some embodiments, the dimension (e.g., width) of the surface 131*s*2 of the fuse element 131 may be greater than that of the surface 131*s*1 of the fuse element 131 along the X direction. In some embodiments, the dimension (e.g., width) of the surface 133*s*2 of the fuse element 133 may be greater than that of the surface 133*s*1 of the fuse element 133 along the X direction. In some embodiments, the dimension (e.g., width) of the surface 133*s*1 of the fuse element 133 may be greater than that of the surface 131*s*2 of the fuse element 131 along the X direction.

Figure 4:
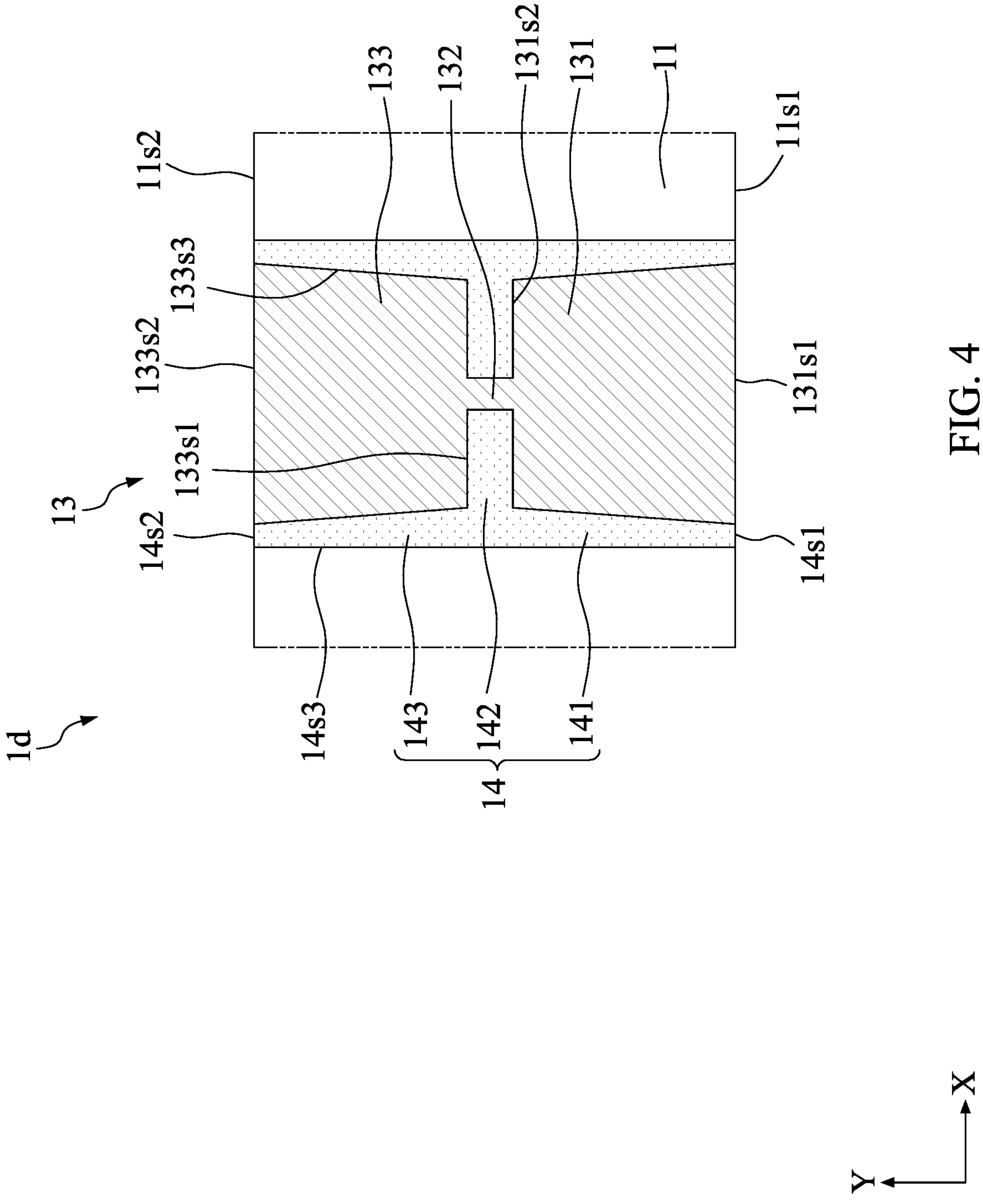
FIG. 4 illustrates a cross-sectional view of a semiconductor device structure, in accordance with some embodiments of the present disclosure.

FIG. 4 illustrates a cross-sectional view of a semiconductor device structure 1*d*, in accordance with some embodiments of the present disclosure. The semiconductor device structure 1*d* may be similar to the semiconductor device structure 1*a* as shown in FIG. 1A, and the differences between them are described as follows.

In some embodiments, the fuse element 131 may be tapered toward the surface 11*s*2 of the substrate 11, and the fuse element 133 may be tapered toward the surface 11*s*1 of the substrate 11. In some embodiments, the dimension (e.g., width) of the surface 131*s*2 of the fuse element 131 may be less than that of the surface 131*s*1 of the fuse element 131 along the X direction. In some embodiments, the portion 141 may be tapered toward the surface 11*s*1 of the substrate 11. In some embodiments, the portion 143 may be tapered toward the surface 11*s*2 of the substrate 11.

Figure 5:
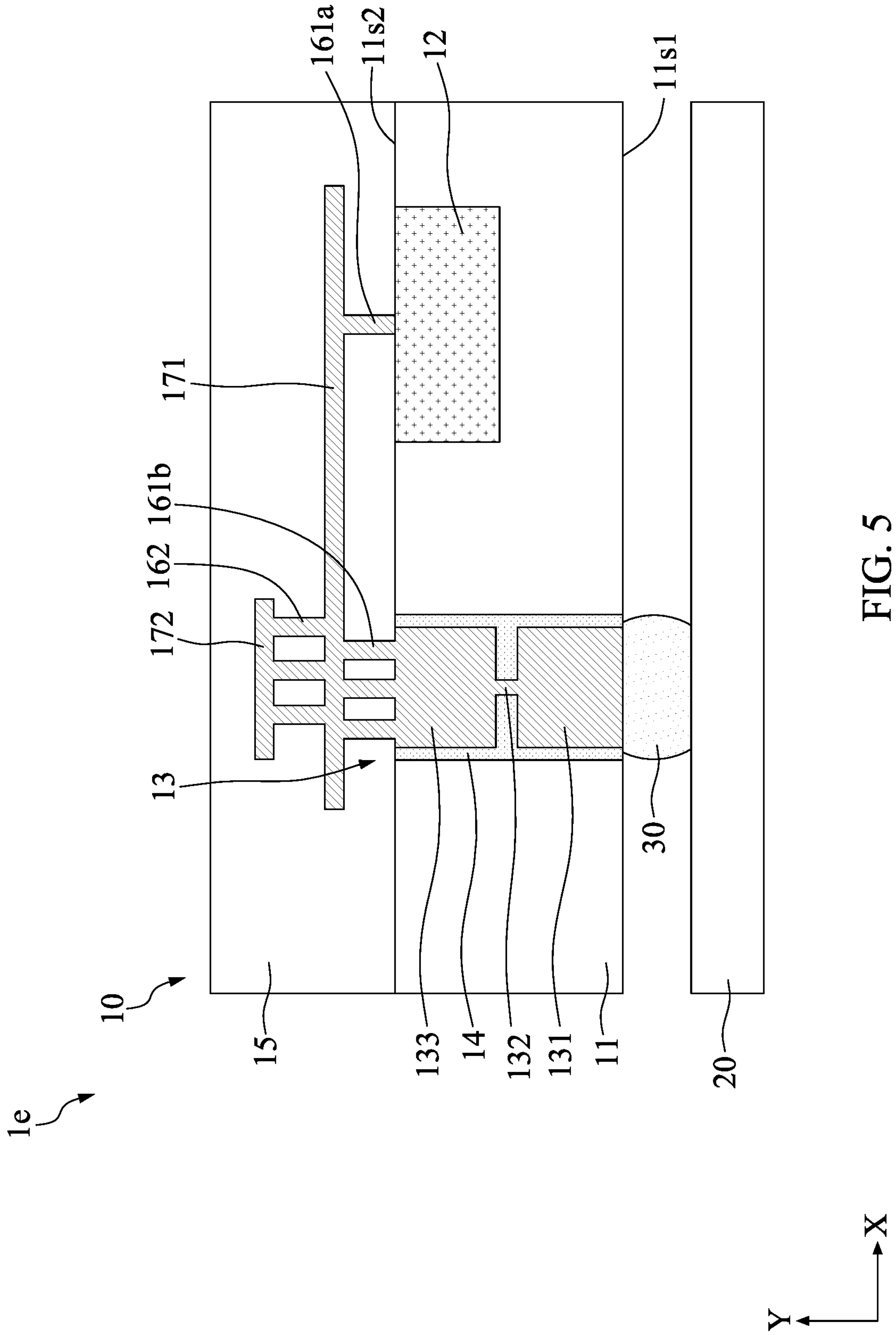
FIG. 5 illustrates a cross-sectional view of a semiconductor device structure, in accordance with some embodiments of the present disclosure.

FIG. 5 illustrates a cross-sectional view of a semiconductor device structure 1*e*, in accordance with some embodiments of the present disclosure. The semiconductor device structure 1*e* may be similar to the semiconductor device structure 1*a* as shown in FIG. 1A, and the differences between them are described as follows.

In some embodiments, the semiconductor device structure 1*e* may include a circuit board 20 and an electrical connector 30.

The circuit board 20 may be disposed on or under the surface 11*s*1 of the substrate 11. In some embodiments, the circuit board 20 may be configured to impose a relatively low voltage on the fuse element 131. The circuit board 20 may include a printed circuit board (PCB), which includes multiple metal layers separated from one another by layers of dielectric material and interconnected by electrically conductive vias. In some embodiments, the fuse element 131 may be electrically connected to the ground by the circuit board 20.

The electrical connector 30 may be disposed between and electrically connect the circuit board 20 and the fuse element 131. The electrical connector 30 may include a solder ball, conductive bump, or the like. The electrical connector 30 may include alloys of gold and tin solder or alloys of silver and tin solder, or other suitable materials.

Figure 6A:
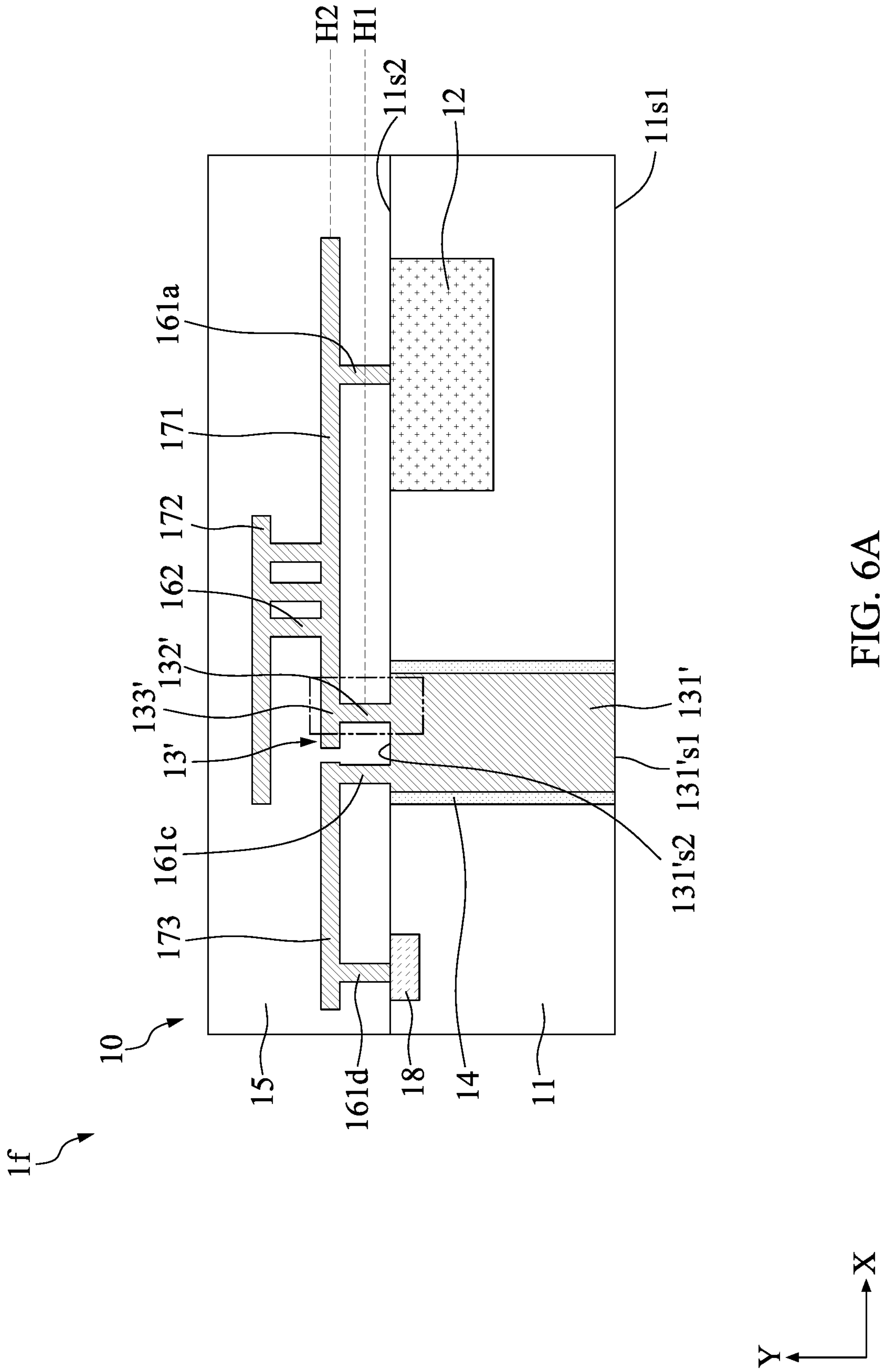
FIG. 6A illustrates a cross-sectional view of a semiconductor device structure, in accordance with some embodiments of the present disclosure.
Figure 6B:
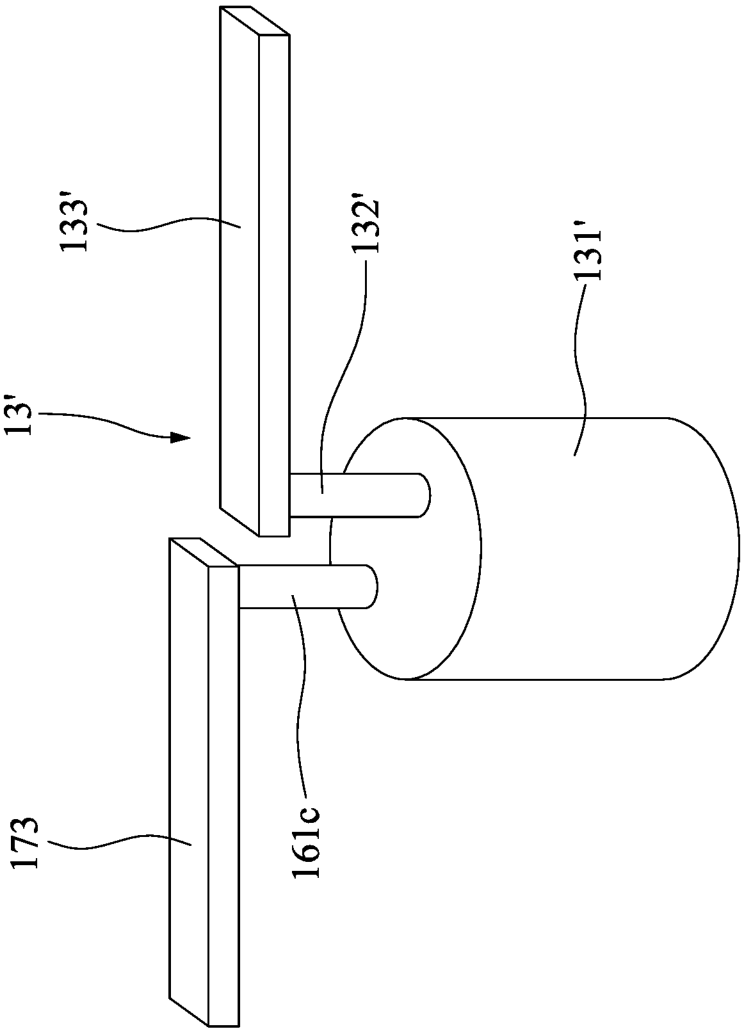
FIG. 6B illustrates a partial perspective view of the semiconductor device structure as shown in FIG. 6A, in accordance with some embodiments of the present disclosure.

FIG. 6A and FIG. 6B illustrates a semiconductor device structure 1*f*, in accordance with some embodiments of the present disclosure. The semiconductor device structure 1*f* may be similar to the semiconductor device structure 1*a* as shown in FIG. 1A, and the differences between them are described as follows. In some embodiments, the semiconductor device structure 1*f* may include a fuse structure 13' and a conductive pad 18.

In some embodiments, the fuse structure 13' may include a fuse element 131', a fuse medium 132', and a fuse element 133'. In some embodiments, the fuse element 131' may fully penetrate the substrate 11. The fuse element 131' may have a surface 131'*s*1 and a surface 131'*s*2 opposite to the surface 131'*s*1. In some embodiments, the surface 131'*s*1 of the fuse element 131' may be substantially aligned with the surface 11*s*1 of the substrate 11. In some embodiments, the surface 131'*s*1 of the fuse element 131' may be exposed by the surface 11*s*1 of the substrate 11. In some embodiments, the surface 131'*s*2 of the fuse element 131' may be substantially aligned with the surface 11*s*2 of the substrate 11. In some embodiments, the surface 131'*s*2 of the fuse element 131' may be exposed by the surface 11*s*2 of the substrate 11.

The fuse medium 132' may be disposed on or over the fuse element 131'. The fuse medium 132' may be embedded within the dielectric structure 15. In some embodiments, the fuse medium 132' may be disposed on or over the surface 11*s*2 of the substrate 11. In some embodiments, the fuse medium 132' may be located at an elevation (or height) H1 substantially the same as that of the conductive via 161*a*.

In some embodiments, the fuse element 133' may be disposed on or over the fuse medium 132'. In some embodiments, the fuse element 133' may be embedded within the dielectric structure 15. In some embodiments, the fuse medium 132' may be located at an elevation (or height) H2 substantially the same as that of the conductive layer 171. In some embodiments, the fuse medium 132' and the conductive layer 171 may be connected and define a monolithic structure, with no or an indistinct boundary between them.

The semiconductor device structure 1*f* may include a conductive via 161*c*, conductive via 161*d*, and a conductive layer 173. The conductive via 161*c* may be disposed between and electrically connect the fuse element 131' and the conductive layer 173. The conductive via 161*d* may be disposed between and electrically connect the conductive pad 18 and the conductive layer 173.

The conductive pad 18 may be disposed within the substrate 11. In some embodiments, the conductive pad 18 may be electrically connected to the fuse structure 13'. In some embodiments, the conductive pad 18 may be configured to impose a relatively low voltage on the fuse element 131'. In some embodiments, the conductive pad 18 may be electrically connected to the ground. Although not shown, it should be noted that the semiconductor device structure 1*f* may include other conductive traces or vias electrically connecting the conductive pad 18 and an external power supply device.

In other embodiments, the conductive pad 18 and the conductive via 161*c* may be omitted. In this embodiment, the circuit board 20 and the electrical connector 30 as shown in FIG. 5 may be disposed under the fuse element 131', which thereby imposes a relatively low voltage to the fuse element 131'.

In this embodiment, a portion of the fuse structure 13' may be located within the dielectric structure 15. Further, the processes for forming the fuse medium 132' and the fuse element 133' may be integrated with those for forming the conductive via 161*a* and the conductive layer 171. Thus, the power consumption is reduced without any additional cost.

Figure 7:
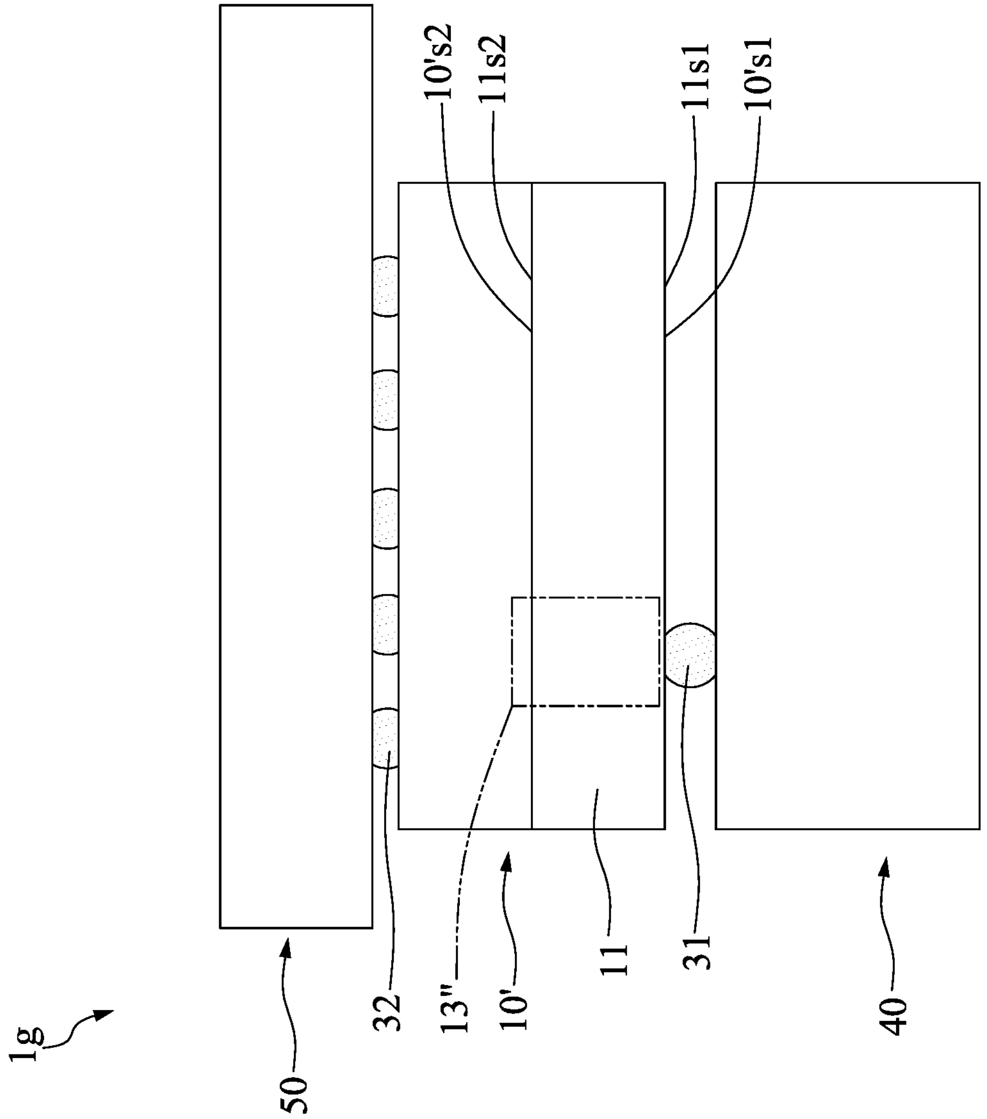
FIG. 7 illustrates a cross-sectional view of a semiconductor device structure, in accordance with some embodiments of the present disclosure.

FIG. 7 illustrates a cross-sectional view of a semiconductor device structure 1*g*, in accordance with some embodiments of the present disclosure. The semiconductor device structure 1*g* may be similar to the semiconductor device structure 1*a* as shown in FIG. 1A, and the differences between them are described as follows.

In some embodiments, the semiconductor device structure 1*g* may include an electronic component 10', an electronic component 40, and a circuit board 50. The electronic component 10' may include a substrate 11 and a fuse structure 13". In some embodiments, the fuse structure 13" may include the fuse structure 13 or fuse structure 13' as shown in FIG. 1A to FIG. 6A. The electronic component 10' may have a surface 10'*s*1 and a surface 10'*s*2 opposite to the surface 10'*s*1. The surface 11*s*1 of the substrate 11 may be defined as the surface 10'*s*1 of the electronic component 10'.

The electronic component 40 may be disposed on or under the surface 10'*s*1 of the electronic component 10'. The electronic component 40 may include a semiconductor die or a chip, such as a logic die (e.g., application processor (AP), system-on-a-chip (SoC), central processing unit (CPU), graphics processing unit (GPU), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies) or other active components. The electronic component 40 may be electrically connected to the electronic component 10' by an electrical connector 31.

The circuit board 50 may be disposed on or over the surface 10'*s*2 of the electronic component 10'. The circuit board 50 may include a PCB, or other suitable interposers. The circuit board 50 may function as a power source configured to provide the electronic component 10' with a higher and/or a lower voltage. The circuit board 50 may be electrically connected to the electronic component 10' by electrical connectors 32.

FIG. 8A to FIG. 8I illustrates one or more stages of an exemplary method for manufacturing a semiconductor device structure according to some embodiments of the present disclosure.

Figure 8A:
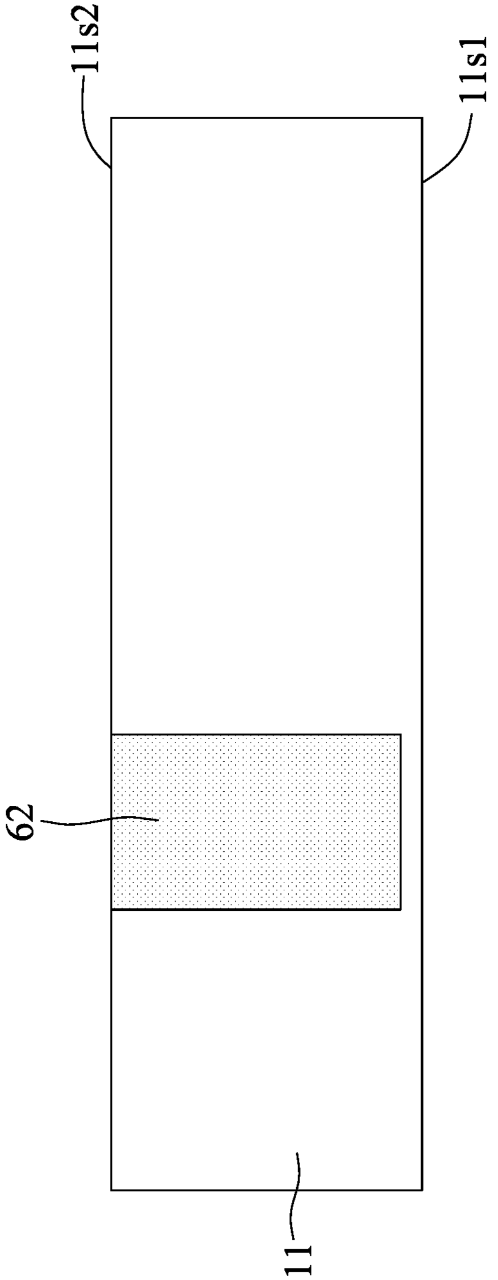
FIG. 8A illustrates one or more stages of an exemplary method for manufacturing a semiconductor device structure according to some embodiments of the present disclosure.

Referring to FIG. 8A, the substrate 11 may be provided. A dielectric layer 60 may be formed within the substrate 11 and exposed by the surface 11*s*2 of the substrate 11. In some embodiments, an opening may be formed by performing an etching technique on the surface 11*s*2 of the substrate 11. Next, a dielectric material is deposited and filled to the opening to form the dielectric layer 60. The dielectric layer 60 may include silicon oxide, silicon nitride, silicon oxynitride, or other suitable materials. The dielectric material may be deposited by atomic layer deposition (ALD), chemical vapor deposition (CVD), low-pressure chemical vapor deposition (LPCVD), physical vapor deposition (PVD), or other suitable processes.

Figure 8B:
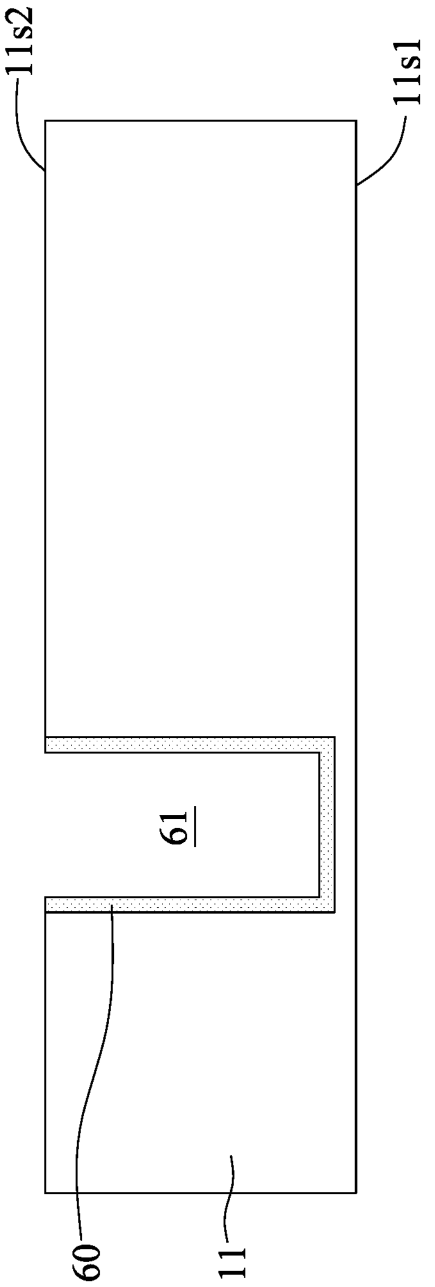
FIG. 8B illustrates one or more stages of an exemplary method for manufacturing a semiconductor device structure according to some embodiments of the present disclosure.

Referring to FIG. 8B, a portion of the dielectric layer 60 may be removed. A trench 61 may be formed. The trench 61 may be recessed from the surface 11*s*2 of the substrate 11. The bottom of the dielectric layer 60 may remain and be exposed.

Figure 8C:
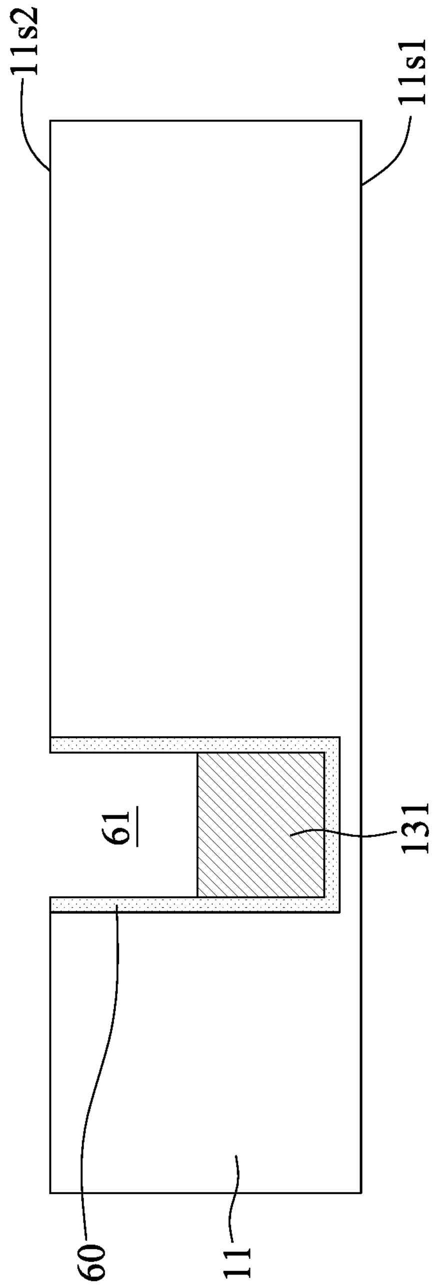
FIG. 8C illustrates one or more stages of an exemplary method for manufacturing a semiconductor device structure according to some embodiments of the present disclosure.

Referring to FIG. 8C, the fuse element 131 may be formed within the trench 61. The fuse element 131 may be formed by PVD, CVD, ALD, or other suitable processes. In some embodiments, a conductive material is deposited to cover the surface 11*s*2 and fill the trench 61. Next, an etching technique may be performed to pattern the conductive material, which thereby defines the fuse element 131. However, the present disclosure is not intended to be limiting.

Figure 8D:
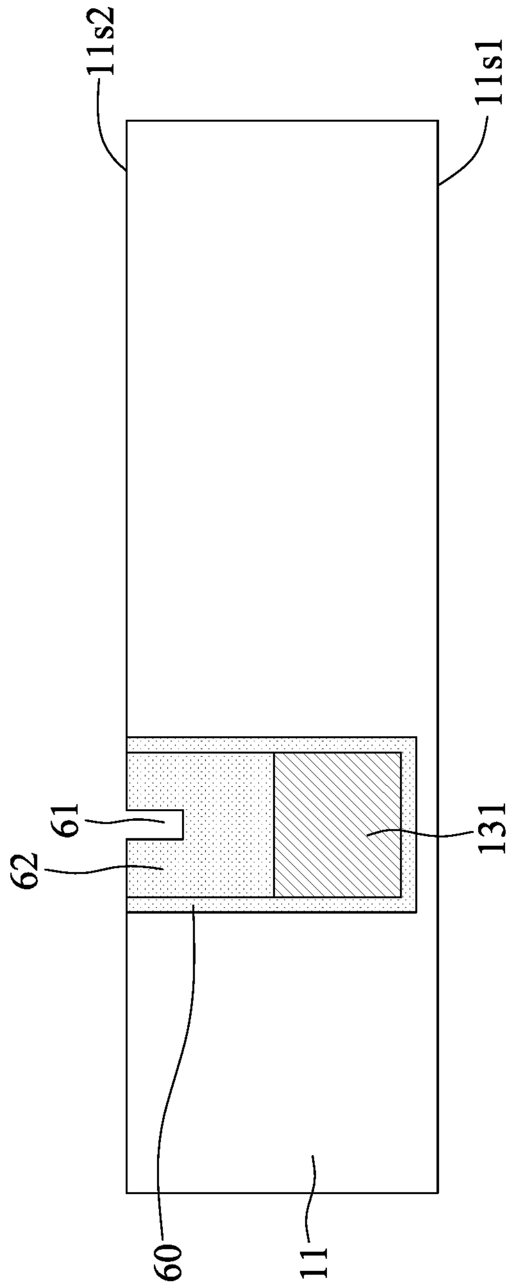
FIG. 8D illustrates one or more stages of an exemplary method for manufacturing a semiconductor device structure according to some embodiments of the present disclosure.

Referring to FIG. 8D, a dielectric layer 62 may be formed within the trench 61. The dielectric layer 62 may cover the fuse element 131. The dielectric layer 62 may be formed and/or patterned by one or more etching techniques and depositing techniques. The dielectric layer 62 may include silicon oxide, silicon nitride, silicon oxynitride, or other suitable materials.

Figure 8E:
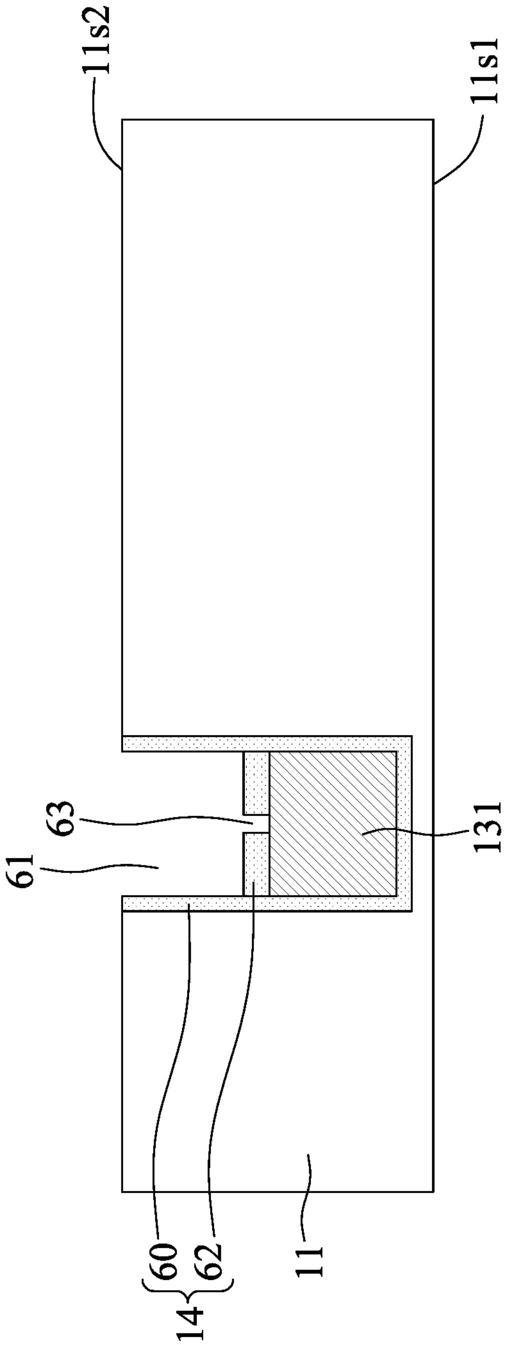
FIG. 8E illustrates one or more stages of an exemplary method for manufacturing a semiconductor device structure according to some embodiments of the present disclosure.

Referring to FIG. 8E, a portion of the dielectric layer 62 may be removed to expose a portion of the upper surface of the fuse element 131. The dielectric layer 60 and dielectric layer 62 may collectively define the buffer layer 14. The dielectric layer 62 may define an opening 63 which defines a location and pattern of a fuse medium.

Figure 8F:
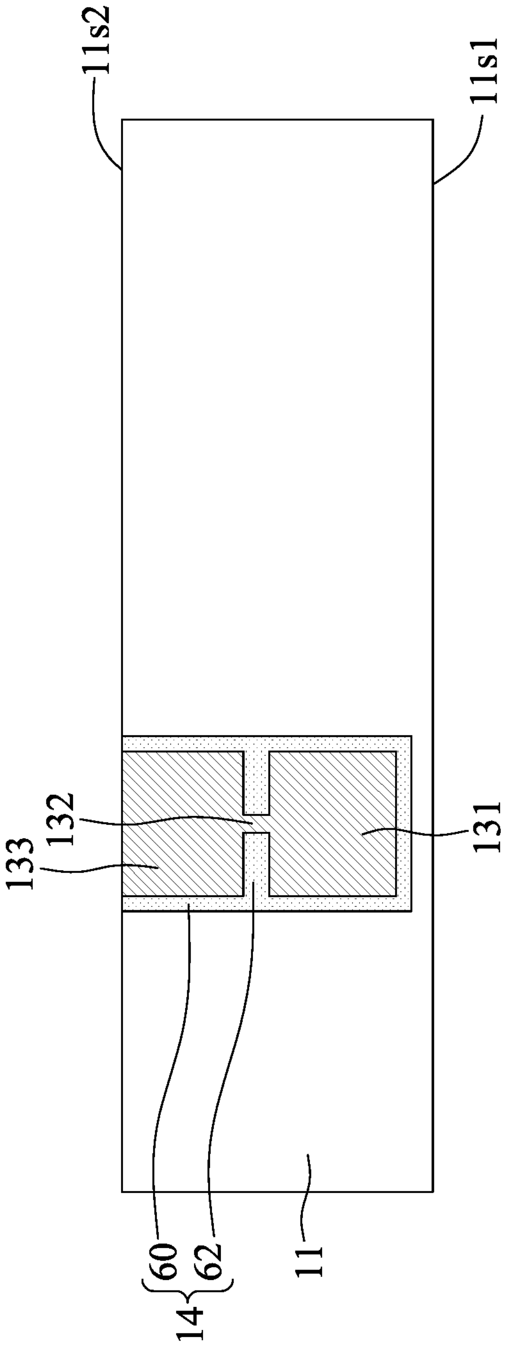
FIG. 8F illustrates one or more stages of an exemplary method for manufacturing a semiconductor device structure according to some embodiments of the present disclosure.

Referring to FIG. 8F, the fuse medium 132 may be formed within the opening 63. The fuse element 133 may be formed to fill the trench 61. The fuse structure 13 may be produced. The fuse medium 132 and the fuse element 133 may be formed and/or patterned by one or more etching techniques and depositing techniques.

Figure 8G:
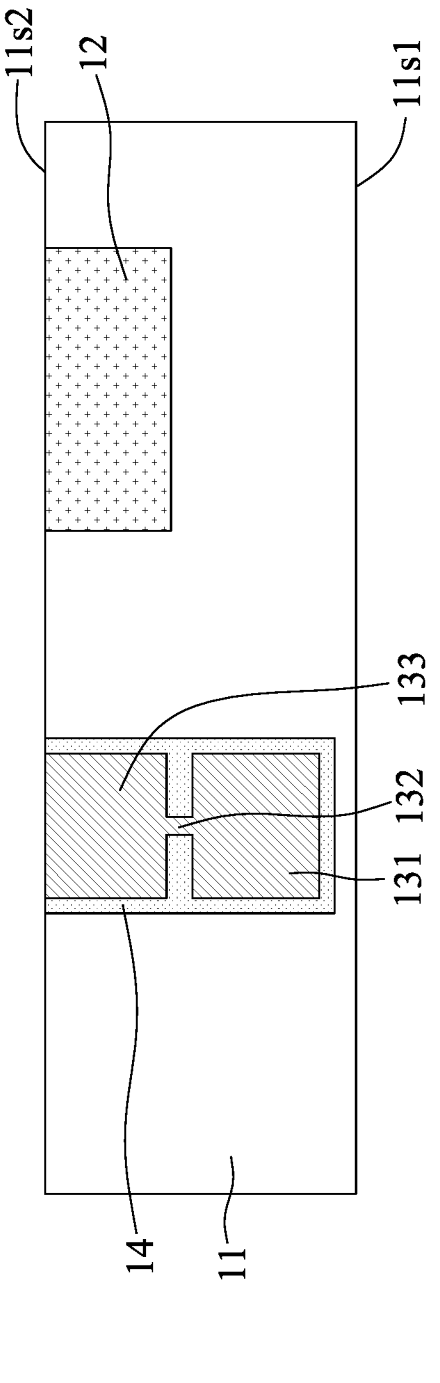
FIG. 8G illustrates one or more stages of an exemplary method for manufacturing a semiconductor device structure according to some embodiments of the present disclosure.

Referring to FIG. 8G, the circuit region 12 may be formed adjacent to the surface 11*s*2 of the substrate 11. Although FIG. 8A to FIG. 8G illustrate that the fuse structure 13 is formed before the circuit region 12, it should be noted that the stages for producing each detailed element of the circuit region 12 and those for producing the fuse structure 13 may be performed in suitable orders.

Referring to FIG. 8H, the conductive vias 161*a* and 161*b* may be formed over the surface 11*s*2 of the substrate 11. The conductive layer 171 may be formed over the conductive vias 161*a* and 161*b*. The conductive via 162 may be formed over the conductive layer 171. The conductive layer 172 may be formed over the conductive via 162. The dielectric structure 15 may be formed over the surface 11*s*2 of the substrate 11.

Figure 8I:
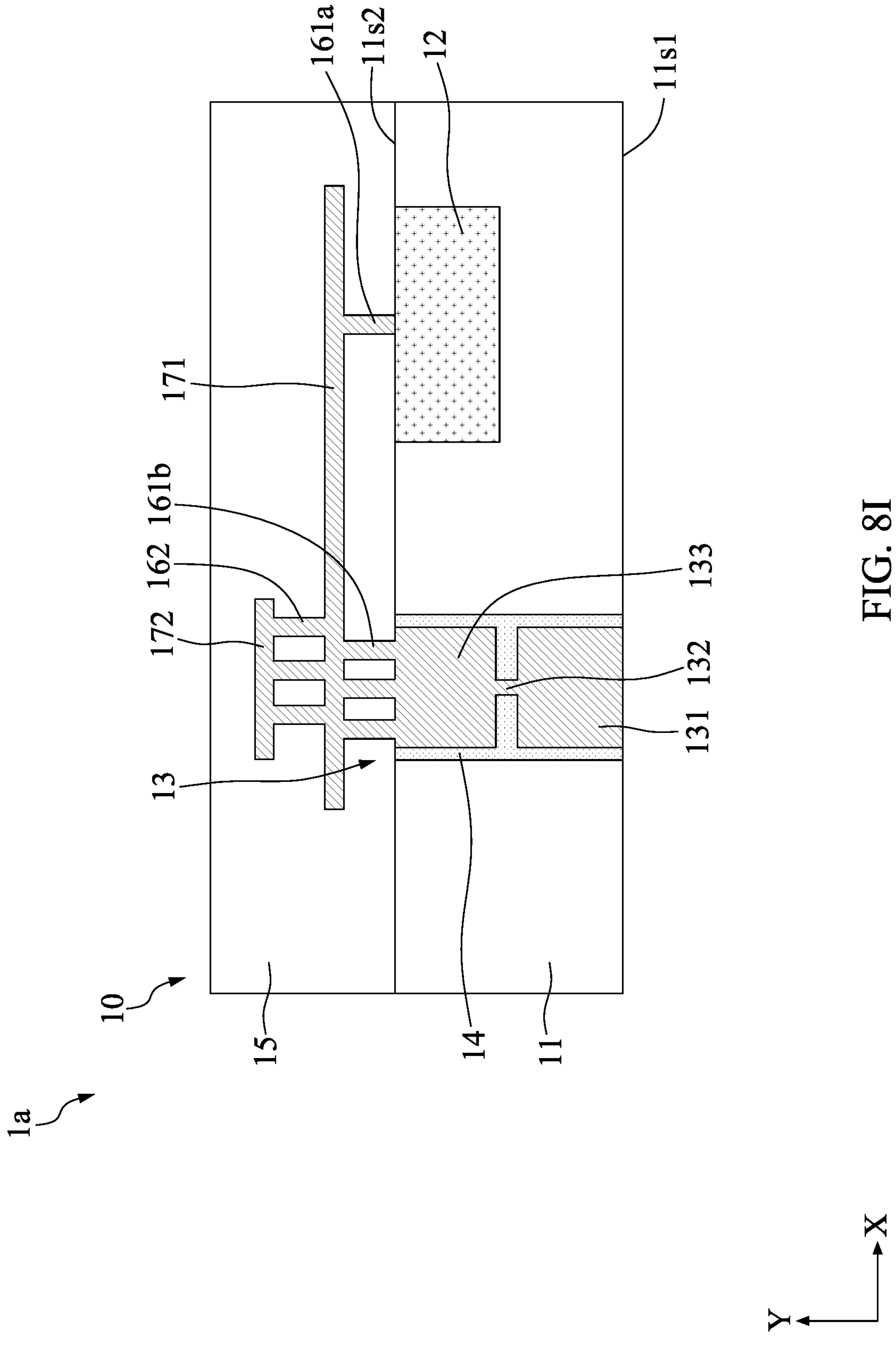
FIG. 8I illustrates one or more stages of an exemplary method for manufacturing a semiconductor device structure according to some embodiments of the present disclosure.

Referring to FIG. 8I, the surface 11*s*1 of the substrate 11 may be removed by a polishing or a grinding technique. The buffer layer 14 and the fuse element 131 may be exposed by the surface 11*s*1 of the substrate 11. As a result, a semiconductor device structure (e.g., the semiconductor device structure 1*a* as shown in FIG. 1A) may be produced.

Figure 9A:
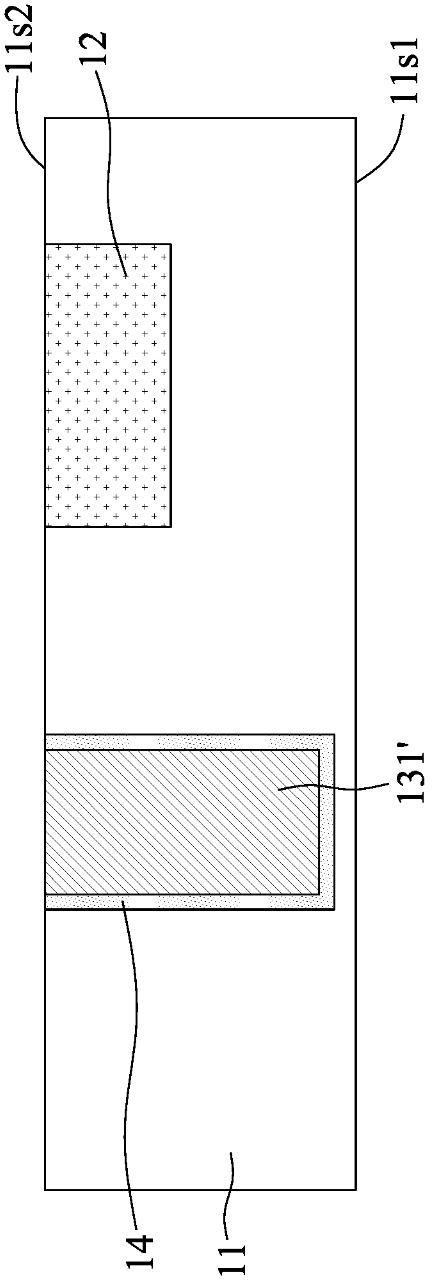
FIG. 9A illustrates one or more stages of an exemplary method for manufacturing a semiconductor device structure according to some embodiments of the present disclosure.
Figure 9B:
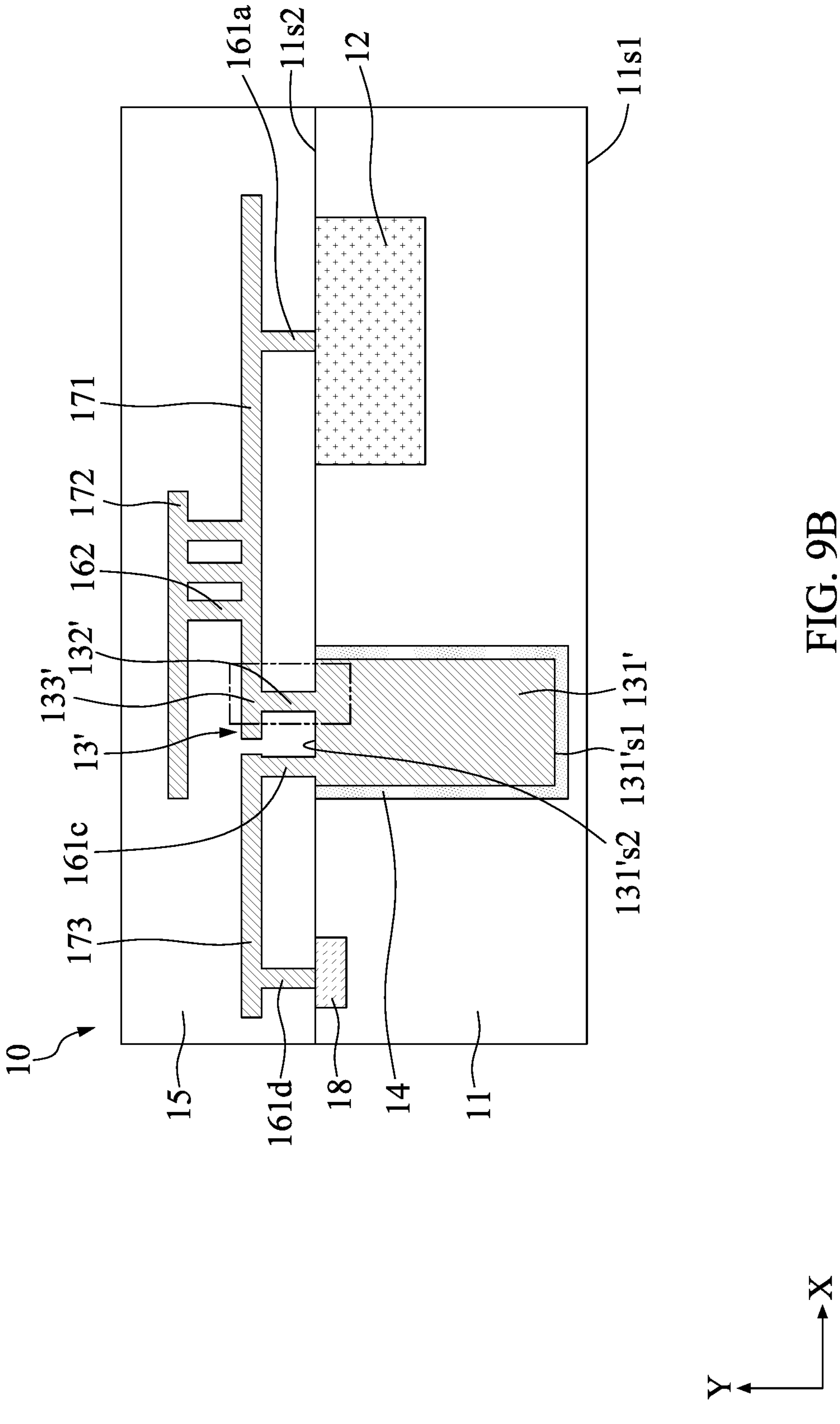
FIG. 9B illustrates one or more stages of an exemplary method for manufacturing a semiconductor device structure according to some embodiments of the present disclosure.
Figure 9C:
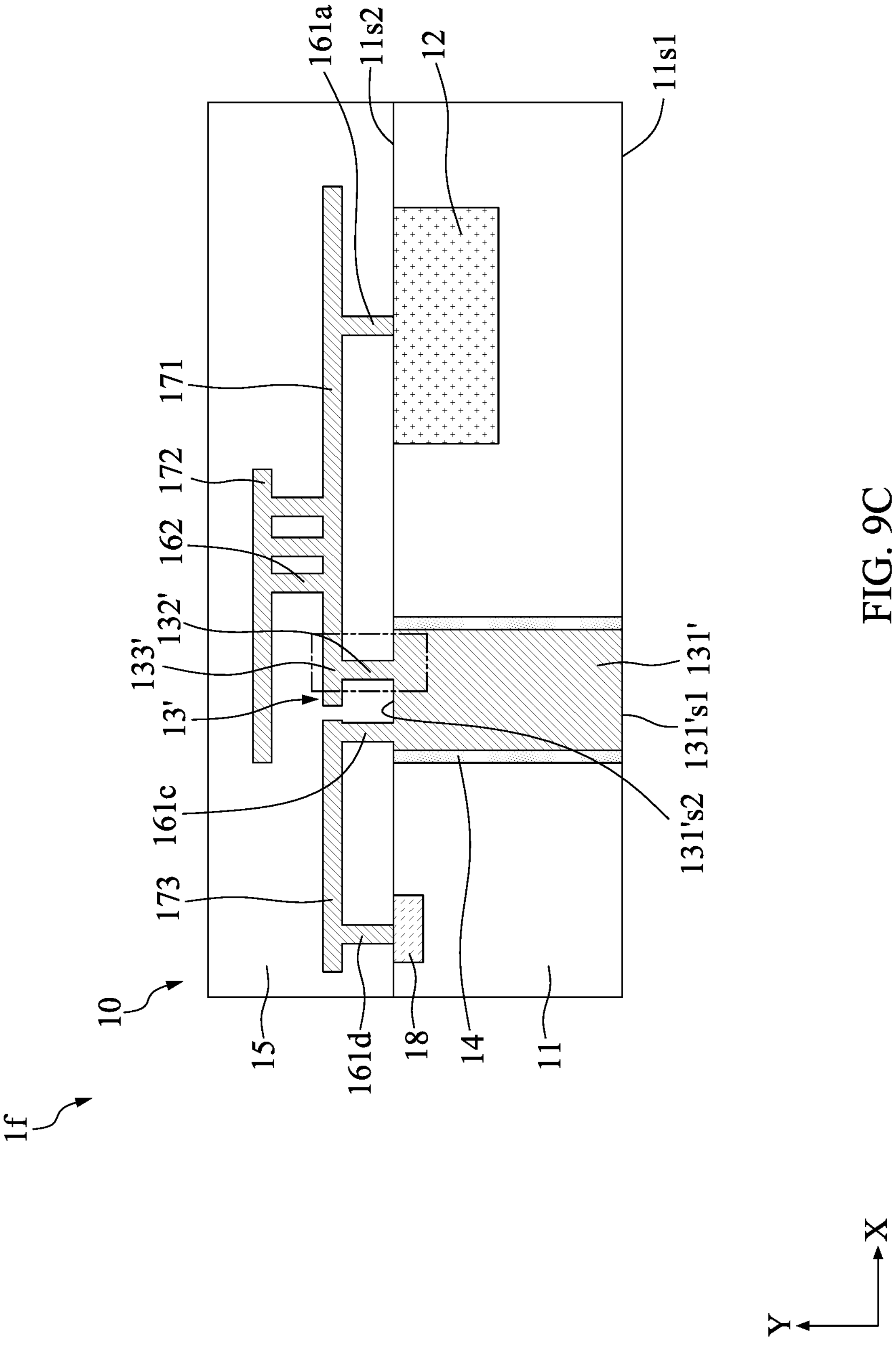
FIG. 9C illustrates one or more stages of an exemplary method for manufacturing a semiconductor device structure according to some embodiments of the present disclosure.

FIG. 9A to FIG. 9C illustrates one or more stages of an exemplary method for manufacturing a semiconductor device structure according to some embodiments of the present disclosure. The initial stage of the illustrated process is the same as, or similar to, the stage illustrated in FIG. 8A through FIG. 8B. FIG. 9A depicts a stage subsequent to that depicted in FIG. 8B.

Referring to FIG. 9A, the fuse element 131' may be formed within the buffer layer 14. The circuit region 12 may be formed adjacent to the surface 11*s*2 of the substrate 11.

Referring to FIG. 9B, the conductive pad 18 may be formed. The conductive vias 161*a*, 161*c*, and 161*d*, and the fuse medium 132' may be formed. The conductive layer 171, which may function as the fuse element 133', and the conductive layer 173 may be formed to cover the conductive vias 161*a*, 161*c*, and 161*d*, and the fuse medium 132'. The conductive via 162 may be formed over the conductive layer 171. The conductive layer 172 may be formed over the conductive via 162. The dielectric structure 15 may be formed over the surface 11*s*2 of the substrate 11. The fuse element 131', the fuse medium 132', and the fuse element 133' may collectively define or exhibit the fuse structure 13'.

Referring to FIG. 9C, the surface 11*s*1 of the substrate 11 may be removed by a polishing or a grinding technique. The buffer layer 14 and the fuse element 131' may be exposed by the surface 11*s*1 of the substrate 11. As a result, a semiconductor device structure (e.g., the semiconductor device structure 1*f* as shown in FIG. 6A) may be produced.

Figure 10:
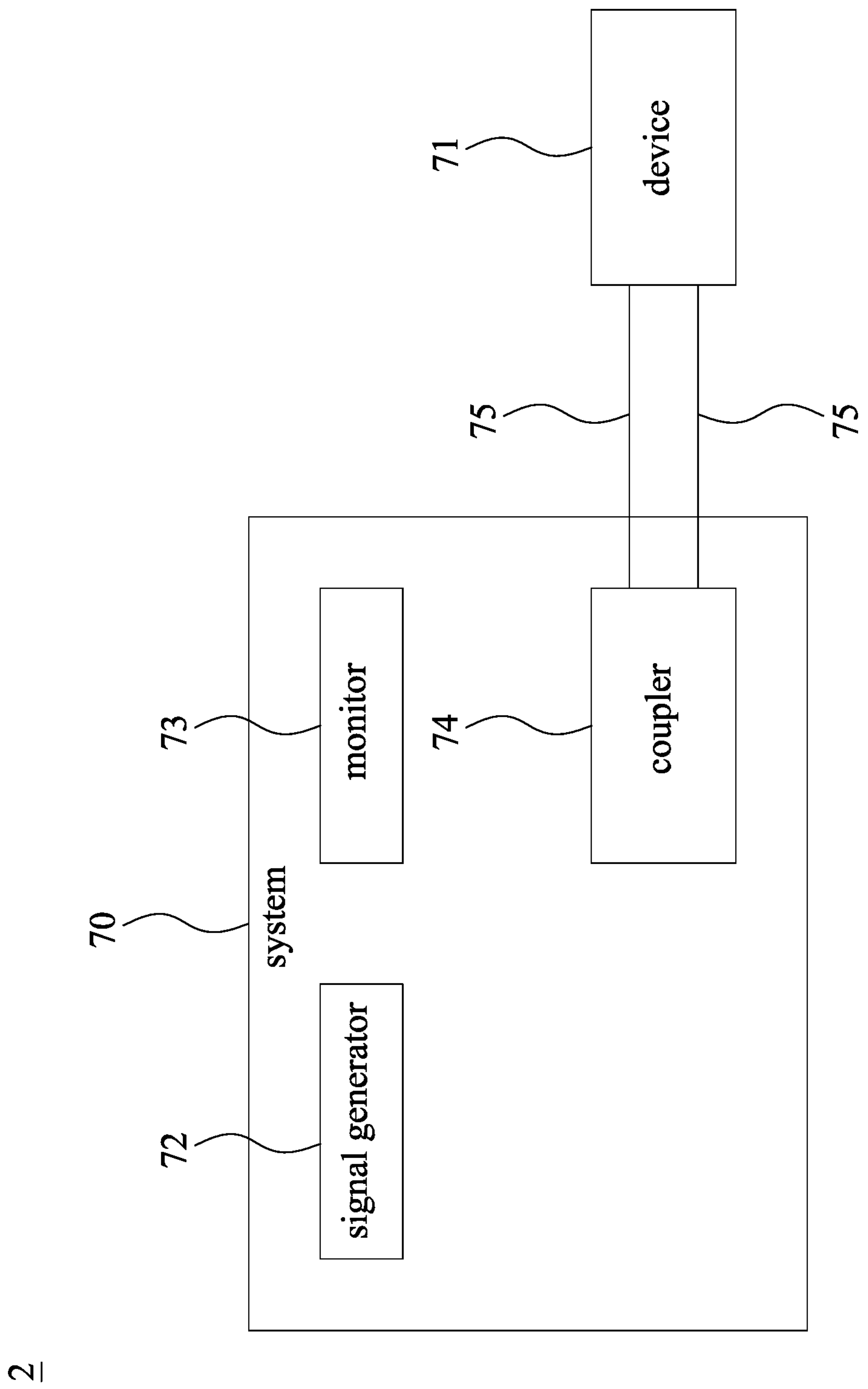
FIG. 10 is a schematic diagram of a system for testing a semiconductor device structure, in accordance with some embodiments of the present disclosure.

FIG. 10 is a diagram of a system 70 for testing a semiconductor device, in accordance with some embodiments of the present disclosure. The semiconductor device structures 1*a* to 1*g* may be used to operate the system 70.

According to FIG. 10, the system 70 is configured to monitor a device 71. In some embodiments, the system 70 is configured to test the device 71. The device 71 may include a memory, memory device, memory die, or memory chip. In some embodiments, the device 71 may include one or more memory cells. The device 71 can be tested after fabrication, and shipped thereafter.

In some embodiments, the system 70 can constitute testing equipment. The system 70 may include hardware and software components that provide a suitable operational and functional environment for testing. In some embodiments, the system 70 may include a signal generator 72, a monitor 73, and a coupler 74.

The signal generator 72 is configured to generate a test signal. In some embodiments, the signal generator 72 can provide a power signal. It should be understood that other electrical signals such as data signals and power signals can further be provided to the device 71.

The monitor 73 is configured to determine a status of the device 71. The monitor 73 can be configured to determine a status of a component of the device 71. The response signals can be identified by the monitor 73 to determine whether a component (e.g., a memory cell) of the device 71 is a normal device or a redundant device.

The coupler 74 is configured to couple the signal generator 72 to the device 71. In some embodiments, the coupler 74 can be coupled to the device 71 by one or more probes 75. The probes 75 can be part of a probe head or probe package (not shown). The probes 75 can be electrically coupled to test conductive terminals (pads) and/or bonding pads disposed on the device 71. The test conductive pads and/or bonding pads provide electrical connections to an interconnect structure (e.g., wiring) of the device 71. For example, some of the probes can be coupled to pads that are associated with a power supply terminal (e.g., VDD) and ground terminal (e.g., VSS) of the device 71. Other probes can be coupled to pads associated with input/output (I/O) terminals (e.g., data signals) of the device 71. As such, the system 70 is operable to apply electrical signals to the device 71 and obtain response signals from the device 71 during testing.

Figure 11:
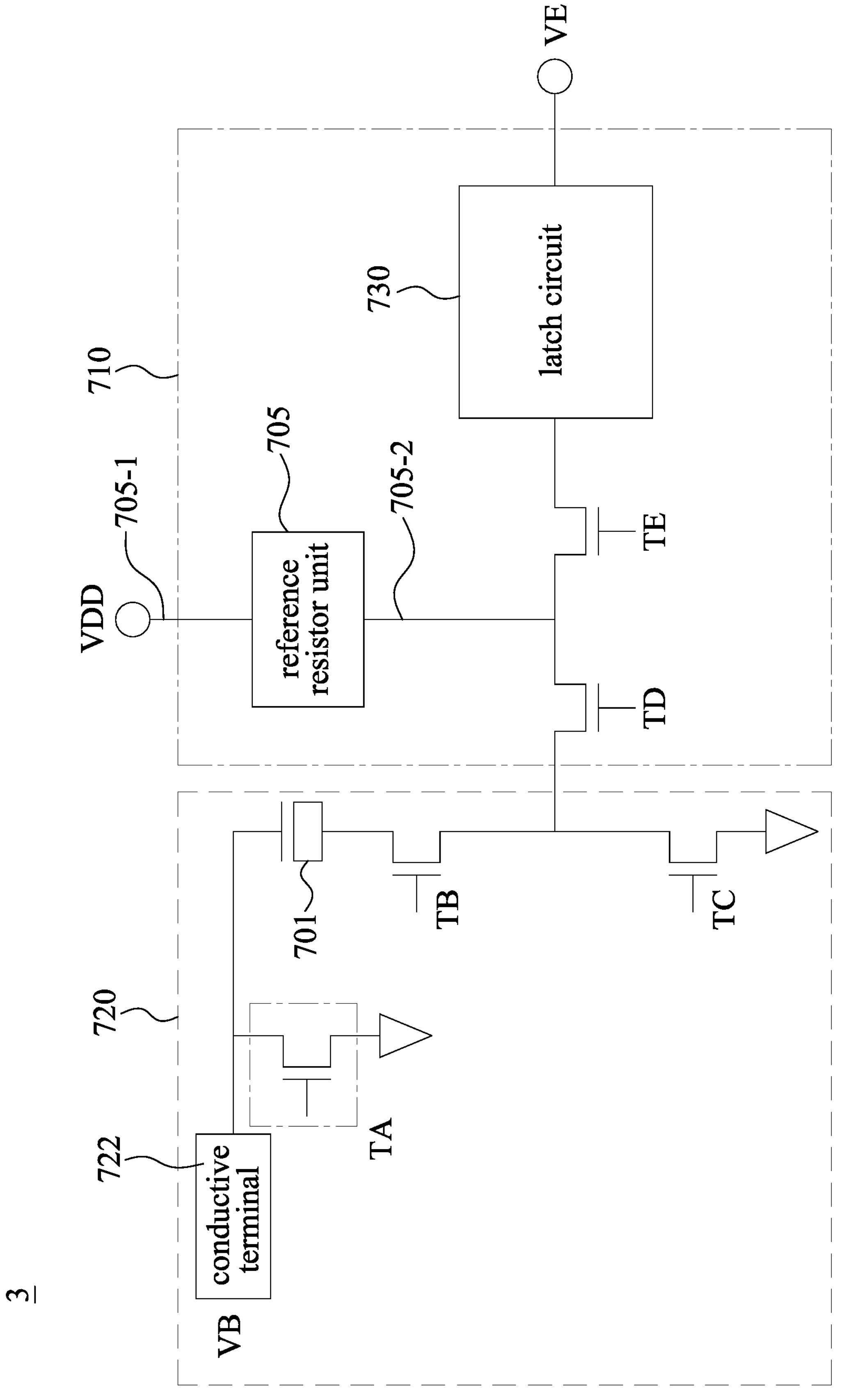
FIG. 11 is a schematic diagram of a semiconductor device structure, in accordance with some embodiments of the present disclosure.

FIG. 11 is a schematic diagram of a circuit 3, in accordance with some embodiments of the present disclosure. The circuit 3 can include a semiconductor device, memory, memory device, memory die, memory chip or other components including a fuse structure.

The circuit 3 can include a fuse 701, an evaluating unit 710, and a status-setting unit 720. In some embodiments, the fuse structures 13, 13', and 13" as shown in FIG. 1A to FIG. 7 may be applicable to the fuse 701. In some embodiments, the evaluating unit 710 can include a reference resistor unit 705, switching circuits TD and TE, and a latch circuit 730. In some embodiments, the fuse 701 and the switching circuits TA and TB can act as a portion of the evaluating unit 710. In some embodiments, the status-setting unit 720 can include the fuse 701, a conductive terminal 722, and two switching circuits TB and TC.

Referring to FIG. 11, the reference resistor unit 705 has a terminal 705-1 configured to receive a power signal VDD. The reference resistor unit 705 has a terminal 705-2 configured to electrically couple with the fuse 701. In some embodiments, the switching circuit TB can be electrically connected to the fuse 701. The switching circuit TD can be electrically connected to the reference resistor unit 705. In some embodiments, the switching circuit TD can be electrically connected to the switching circuit TB. In some embodiments, the fuse 701 can be coupled to ground through the switching circuits TB and TC. The switching circuit TA can be electrically connected to the fuse 701. The switching circuit TA can be electrically connected to ground.

In some embodiments, the latch circuit 730 is electrically coupled to the reference resistor unit 705. The latch circuit 730 can be electrically coupled to the fuse 701 through the switching circuits TB, TD, and TE. In some embodiments, the switching circuit TE is electrically connected to the reference resistor unit 705. The switching circuit TE can be electrically connected to the latch circuit 730. In some embodiments, the switching circuit TE can be electrically connected to the switching circuit TD. An evaluation/output signal may be obtained at a conductive terminal VE of the latch circuit 730.

Referring to FIG. 11, the conductive terminal 722 can be electrically connected to the fuse 701. The conductive terminal 722 may be a test pad, a probe pad, a conductive pad, a conductive terminal, or other suitable elements. In some embodiments, the conductive terminal 722 is configured to receive a status-setting signal VB. In some embodiments, the switching circuit TB can be electrically connected to the fuse 701. The switching circuit TC can be electrically connected to the switching circuit TB. The switching circuit TB can be electrically connected between the switching circuit TC and the fuse 701. The switching circuit TC can be electrically connected to ground.

In some embodiments, each of the switching circuits TA, TB, TC, TD, and TE can be a switch, transistor, or other switchable circuits.

Figure 12:
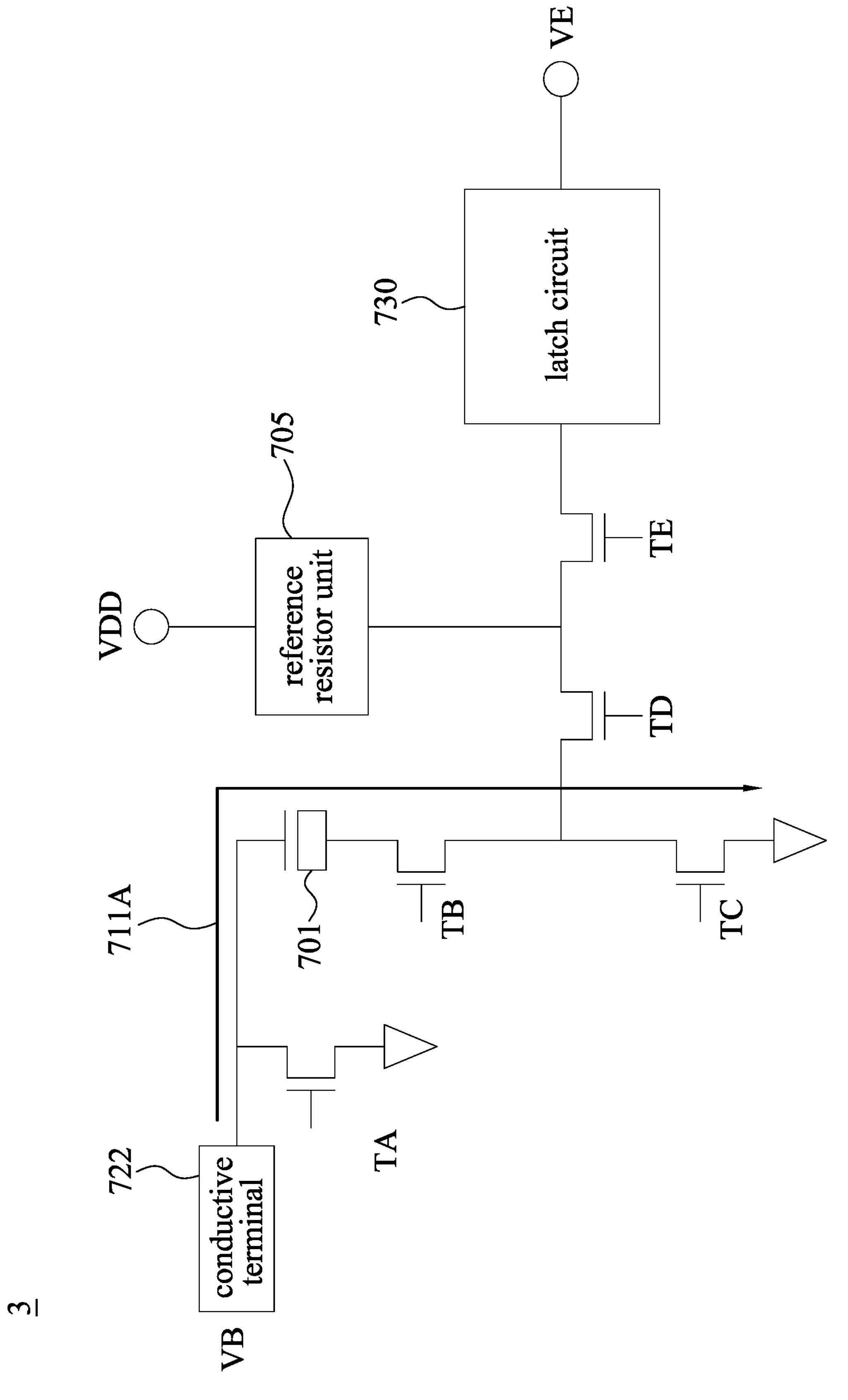
FIG. 12 is a schematic diagram of a semiconductor device structure, in accordance with some embodiments of the present disclosure.

FIG. 12 shows a circuit 3, in accordance with some embodiments of the present disclosure. In some embodiments, the switching circuits TB and TC are configured to be turned on to establish a conductive path 711A in response to the status-setting signal VB. In some embodiments, the conductive path 711A can pass through the fuse 701 to ground in response to the status-setting signal VB. In some embodiments, when the status-setting signal VB is applied to the conductive terminal 722, the conductive path 711A passes through the fuse 701, the switching circuits TB and TC, and to ground in order. In addition, the switching circuits TA, TD, and TE can be configured to be turned off, such that the conductive path 711A can pass through the fuse 701.

In some embodiments, the status-setting signal VB may be a voltage signal or a current signal. In some embodiments, the status-setting signal VB may be a voltage signal having a voltage exceeding the normal operating voltage of the circuit 3. In some embodiments, the status-setting signal VB can have a voltage in a range of 4-6V. When the status-setting signal VB is applied, a status of the fuse 701 may be changed. For example, the status-setting signal VB can be configured to burn down a fuse medium of the fuse 701. After the fuse medium of the fuse 701 is burned down, the physical property, such as resist, density or other properties, of the fuse medium of the fuse 701 is changed. Before the status-setting operation, the fuse 701 may have a relatively high (or low) resistance. After the status-setting operation, the fuse 701 may have a relatively low (or high) resistance. In the present disclosure, a fuse element before the status-setting operation can be referred to as an "unblown" fuse element, and a fuse element after the status-setting operation can be referred to as a "blown" fuse element.

In some embodiments, the blown fuse 701 has a resistance higher than the resistance of the unblown fuse 701. In other embodiments, the fuse 701 may be an anti-fuse, and the resistance of the blown fuse 701 is lower than the resistance of the unblown fuse 701.

For example, when the fuse 701 functions as an anti-fuse, the resistance of the unblown fuse 701 can be in a range of 1.5M to 20MΩ. After the status-setting operation, the resistance of the blown fuse 701 can be around 2k to 800kΩ. In some embodiments, the resistance of the blown fuse 701 can be around 100k to 800kΩ.

Figure 13:
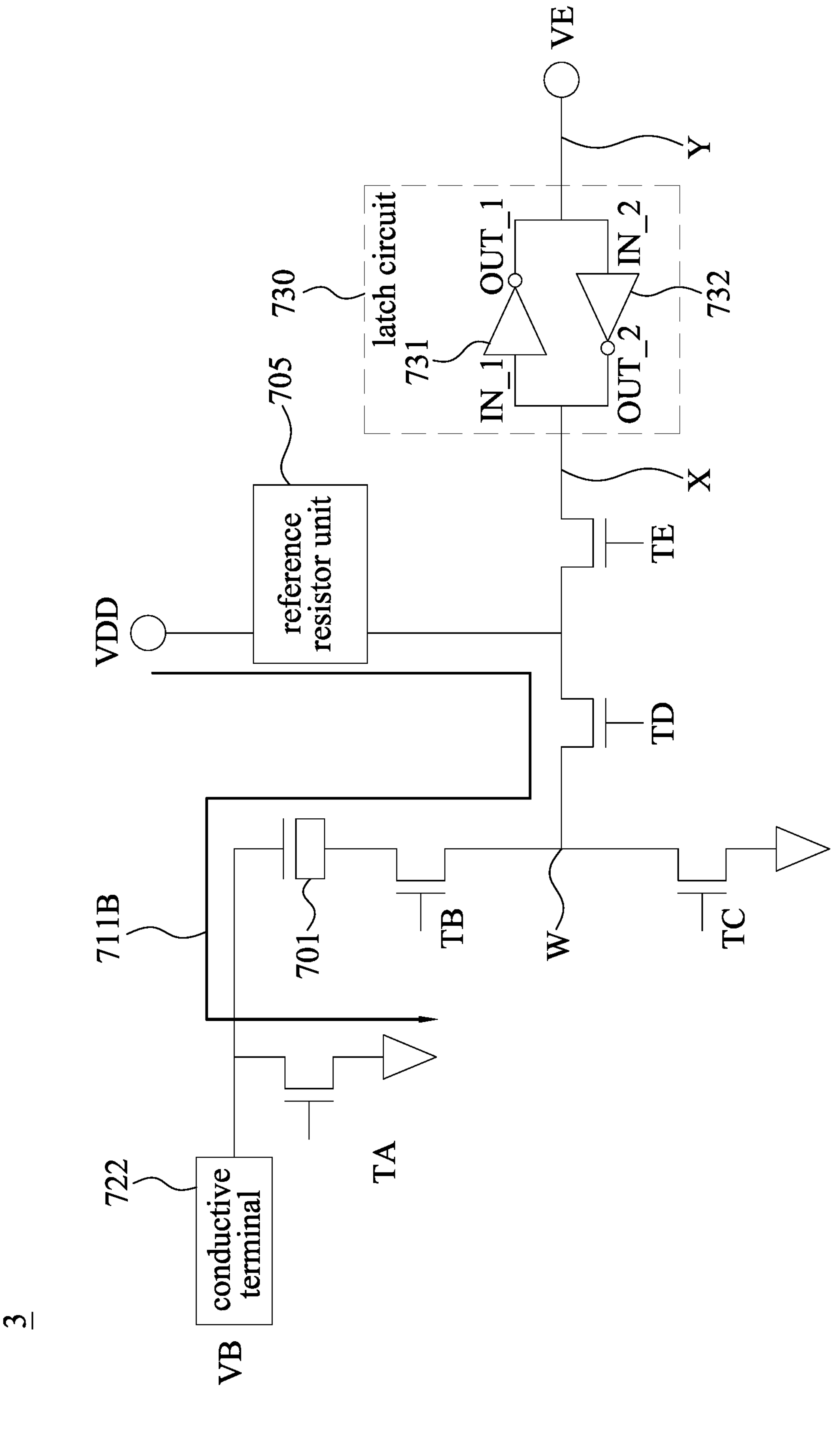
FIG. 13 is a schematic diagram of a semiconductor device structure, in accordance with some embodiments of the present disclosure.

FIG. 13 is a schematic diagram of a circuit 3, in accordance with some embodiments of the present disclosure. In some embodiments, the switching circuits TA, TB and TD are configured to be turned on to establish a conductive path 711B. In some embodiments, the conductive path 711B can pass through the reference resistor unit 705 and the fuse 701 to ground in response to the power signal VDD. In some embodiments, the switching circuit TC is configured to be turned off so as to establish the conductive path 711B. In some embodiments, when the power signal VDD is applied to the terminal 705-1 shown in FIG. 11 of the reference resistor unit 705, the conductive path 711B passes through the reference resistor unit 705, the switching circuits TD and TB, the fuse 701, and the switching circuit TA to ground, in that order. In some embodiments, the power signal VDD can be a normal operating voltage. In some embodiments, the power provided by the power signal VDD can be less than that of the status-setting signal VB. For example, the power signal VDD can have a voltage of around 1.2V.

In some embodiments, a signal X is generated at a node W between the reference resistor 705 and the fuse 701, in response to the power signal VDD. Referring to FIG. 13, the signal X generated at the node W can be transmitted to the latch circuit 730, through the switching circuits TD and TE.

In some embodiments, the latch circuit 730 is configured to read the signal X generated at the node W between the reference resistor 705 and the fuse 701. The node W is between the reference resistor 705 and the fuse 701 with or without other elements coupled therebetween. For example, the node W may be between the switching circuits TB and TD. In one embodiment, the node W may be between the switching circuit TD and the reference resistor unit 705. In another embodiment, the node W may be between the switching circuit TB and the fuse 701. In some embodiments, the signal X may include a voltage signal or a current signal.

In some embodiments, the switching circuit TE is configured to be turned on to transmit the signal X to the latch circuit 730. During an evaluation period, when the switching circuits TA, TB, TD, and TE are configured to be turned on to establish the conductive path 711B, the signal X can be obtained at the node W and transmitted to the latch circuit 730. In some embodiments, the latch circuit 730 can read the signal X. In some embodiments, the latch circuit 730 can transform the signal X into a signal Y. For example, the transformation of the signal X operated by the latch circuit 730 may include converting or inverting one signal into another. In one embodiment, the transformation of the signal X operated by the latch circuit 730 may include phase shifting. In another embodiment, the transformation of the signal X operated by the latch circuit 730 may include amplification.

In some embodiments, the latch circuit 730 can convert the analog signal X to a logic signal Y. The latch circuit 730 can compare the signal X with a threshold, and, based on the result of the comparison between the signal X and the threshold, output the signal Y. For example, when the signal X exceeds the threshold, the latch circuit 730 may output a logic low signal Y. On the contrary, when the signal X is lower than the threshold, the latch circuit 730 may output a logic high signal Y. In some embodiments, the signal Y has a logic value opposite to that of the signal X. For example, when the signal X is logic "0," the signal Y will be logic "1." On the contrary, when the signal X is logic "1," the signal Y will be logic "0." In some embodiments, the latch circuit 730 can store the signal Y.

Referring to FIG. 13, the latch circuit 730 can include two inverters 731 and 732. In some embodiments, the latch circuit 730 can include more than two inverters. In some embodiments, the latch circuit 730 may be a latch circuit of another type. The inverter 731 has an input terminal IN_1 and an output terminal OUT_1. The inverter 732 has an input terminal IN_2 and an output terminal OUT_2. In some embodiments, the input terminal IN_1 of the inverter 731 can be coupled to the reference resistor unit 705, through the switching circuit TE. The input terminal IN_1 of the inverter 731 can be coupled to the fuse 701, through the switching circuits TB, TD, and TE. The output terminal OUT_1 of the inverter 731 can be coupled to the conductive terminal VE. In some embodiments, the input terminal IN_1 of the inverter 731 may connect to the output terminal OUT_2 of the inverter 732. The output terminal OUT_1 of the inverter 731 may connect to the input terminal IN_2 of the inverter 732. That is, the input terminal IN_2 of the inverter 732 can be coupled to the conductive terminal VE. The output terminal OUT_2 of the inverter 732 can be coupled to the reference resistor unit 705. The output terminal OUT_2 of the inverter 732 can be coupled to the fuse 701.

To evaluate the status of the fuse 701 (i.e., whether the fuse 701 is blown), the signal X (or signal Y) is monitored. The signal X is dependent on the resistance of the fuse 701. The signal X is compared with a predetermined signal or a threshold. Based on the comparison of the signal X and the predetermined signal, the logic signal Y can be output at the conductive terminal VE. When the signal X exceeds the predetermined signal, it indicates that the fuse 701 is not blown. When the signal X fails to exceed the predetermined signal, it indicates that the fuse 701 is blown.

In some embodiments, if the signal X exceeds the predetermined signal, the latch circuit 730 can output a logic low signal Y. That is, the logic low signal Y indicates that the fuse 701 is not blown. When the signal X is lower than the predetermined signal, the latch circuit 730 may output a logic high signal Y. In other words, logic high signal Y indicates that the fuse 701 is blown.

The signal Y may be obtained at the conductive terminal VE, such that the status of the fuse 701 can be determined. The status of the fuse 701 can be utilized to determine whether the semiconductor device structure is a redundant device or a normal device.

Figure 14:
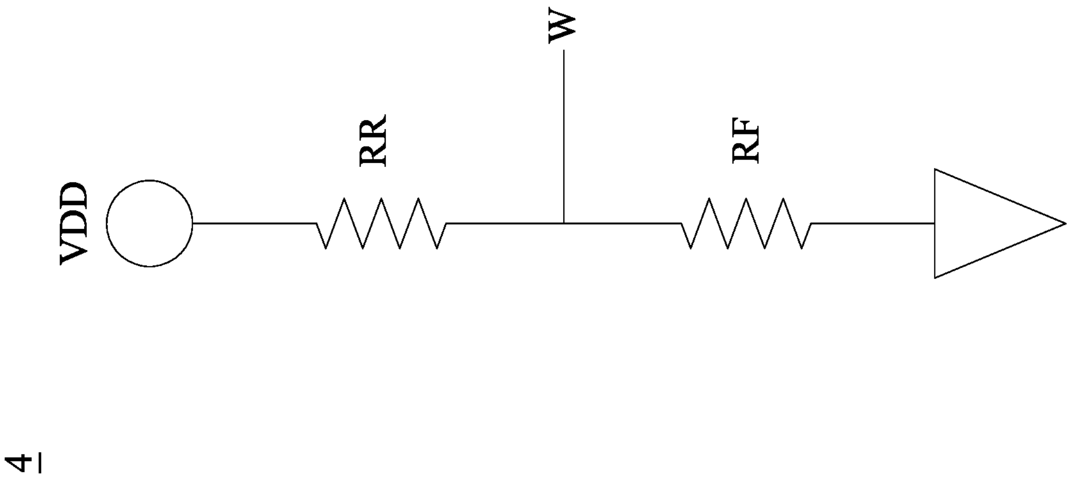
FIG. 14 illustrates an equivalent circuit of a portion of the semiconductor device shown in FIG. 13, in accordance with some embodiments of the present disclosure.

FIG. 14 illustrates an equivalent circuit 4 of a portion of the circuit 3 when the conductive path 711B is established, in accordance with the embodiments of the subject disclosure. The equivalent circuit 4 is in configuration with switching circuits TA, TB and TD when they are on and in configuration with the switching circuit TC when it is off. In other words, the equivalent circuit 4 presents a simplified circuit through which the conductive path 711B passes.

The equivalent circuit 4 includes two resistors RR and RF. In some embodiments, the resistor RR can be the resistance of the reference resistor unit 705. The resistor RF can be the resistance of the fuse 701. In some embodiments, the resistor RR can be connected to the resistor RF in series. A node W is between the resistor RR and the resistor RF. That is, the node W in FIG. 14 corresponds to the node in FIG. 13. In some embodiments, the resistor RR is configured to receive a power signal VDD. For example, the power signal VDD may be a voltage of 1.2V. In some embodiments, the resistor RF is connected to the resistor RR and the ground.

Referring to FIG. 14, the signal X may be a voltage signal obtained at the node W. Therefore, the signal X can be calculated according to equation 1.

$$X = \frac{RF}{RR + RF} VDD, \quad \text{[Equation. 1]}$$

In equation 1, X represents the voltage of the signal X; RR represents the resistance of the reference resistor unit 705; RF represents the resistance of the fuse 701; and VDD represents the power signal.

To evaluate the status of the fuse 701 accurately, the resistance RR can fall below the resistance RF of the unblown fuse element. In addition, the resistance RR can exceed the resistance RF of the blown fuse element. In some embodiments, the resistance RR may be between the resistance of the unblown fuse element and the resistance of the blown fuse element.

In some embodiments, the predetermined signal has a voltage less than that of the power signal VDD. In some embodiments, the predetermined signal has a voltage, which fractionally multiplies the power signal VDD. For example, if the predetermined signal has a voltage half of the power signal VDD, for example of 1.2V, the predetermined signal can have a voltage of 0.6V. That is, when the result of the equation 1 exceeds 0.6V, the signal X at the node W would be determined as logic high, indicating that the fuse 701 is not blown, and when less than 0.6V, the signal X at the node W would be determined as logic low, indicating that the fuse 701 is blown.

Figure 15:
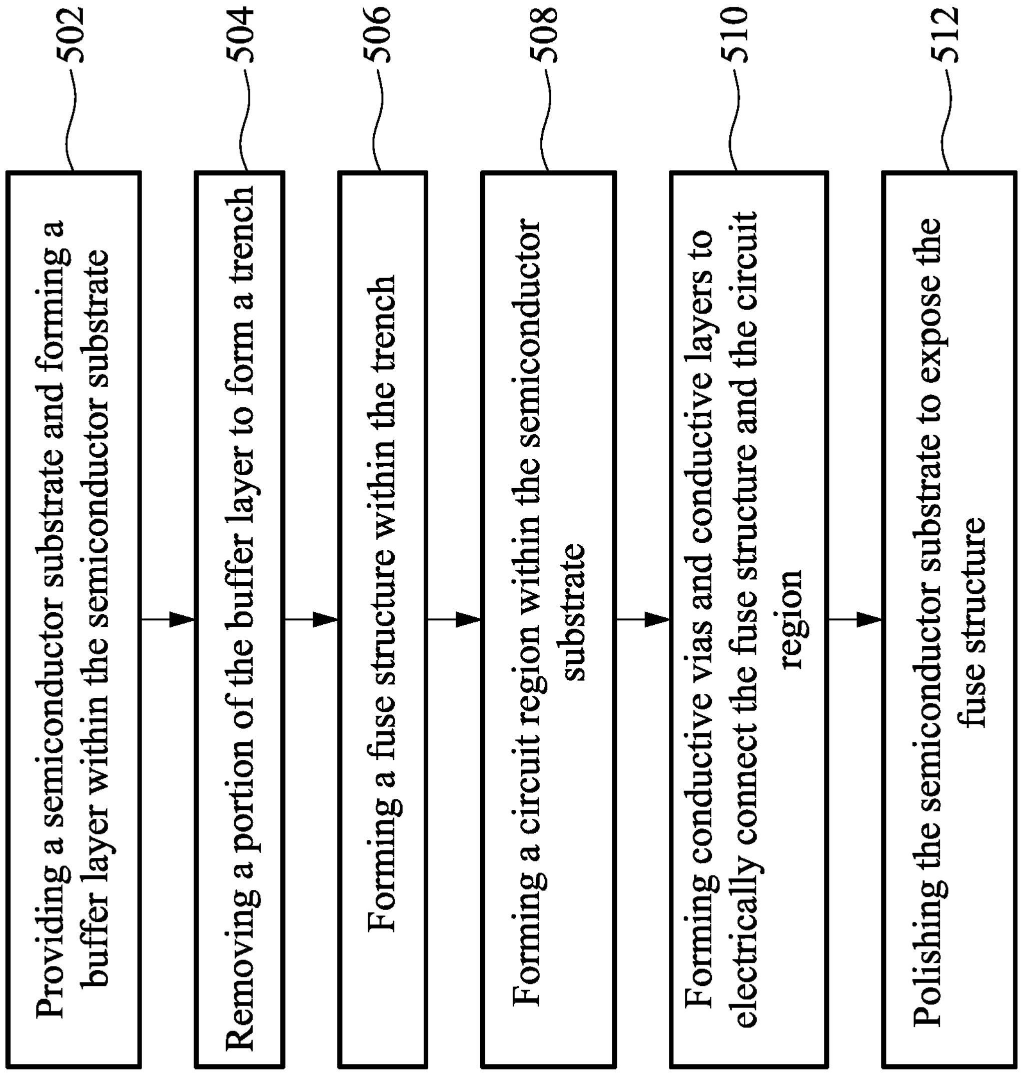
FIG. 15 is a flowchart illustrating a method of manufacturing a semiconductor device structure, in accordance with some embodiments of the present disclosure.

FIG. 15 is a flowchart illustrating a method 500 of manufacturing a semiconductor device structure, in accordance with some embodiments of the present disclosure.

The method 500 begins with operation 502, in which a semiconductor substrate is provided. A buffer layer may be formed within the semiconductor substrate and exposed by the upper surface of the semiconductor substrate.

The method 500 continues with operation 504 in which a trench is formed by removing a portion of the buffer layer.

The method 500 continues with operation 506 in which a fuse structure is formed within the trench. The fuse structure may include a first fuse element, a fuse medium, and a second fuse element arranged along a direction from the lower surface to the upper surface of the semiconductor substrate.

The method 500 continues with operation 508 in which a circuit region is formed adjacent to the upper surface of the semiconductor substrate.

The method 500 continues with operation 510 in which conductive vias and conductive layers are formed to electrically connect the circuit region and the fuse structure.

The method 500 continues with operation 512 in which the semiconductor substrate is polished. The first fuse element of the fuse structure is exposed.

The method 500 is merely an example, and is not intended to limit the present disclosure beyond what is explicitly recited in the claims. Additional operations can be provided before, during, or after each operation of the method 500, and some operations described can be replaced, eliminated, or reordered for additional embodiments of the method. In some embodiments, the method 500 can include further operations not depicted in FIG. 15. In some embodiments, the method 500 can include one or more operations depicted in FIG. 15.

One aspect of the present disclosure provides a semiconductor device structure. The semiconductor device structure includes a semiconductor substrate, a fuse structure, and a transistor. The semiconductor substrate has a first surface and a second surface opposite to the first surface. The fuse structure is at least partially disposed within the semiconductor substrate. The transistor is electrically connected to the fuse element. The fuse element includes a first fuse element, a second fuse element, and a fuse medium connecting the first fuse element and the second fuse element. The first fuse element, the second fuse element, and the fuse medium are arranged along a first direction from the first surface toward the second surface of the semiconductor substrate.

Another aspect of the present disclosure provides a semiconductor device structure. The semiconductor device structure includes a semiconductor substrate, a fuse structure, and a transistor. The semiconductor substrate has a first surface and a second surface opposite to the first surface. The fuse structure penetrates the semiconductor substrate from the first surface to the second surface of the semiconductor substrate. The transistor electrically connected to the fuse element.

Another aspect of the present disclosure provides a method of manufacturing a semiconductor device structure. The method includes: providing a semiconductor substrate having a first surface and a second surface opposite to the first surface; forming a fuse structure within the semiconductor substrate; and forming a transistor within the semiconductor substrate, wherein the transistor is electrically connected to the fuse structure.

The semiconductor device structure includes a vertical fuse structure which penetrates a semiconductor substrate. The processes for producing the fuse structure can be integrated with those for defining the routing path (e.g., vias and metal layers) over the semiconductor substrate. The power consumption of a device can be improved without additional costs.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device structure, comprising:

a semiconductor substrate having a first surface and a second surface opposite to the first surface;

a fuse structure at least partially disposed within the semiconductor substrate;

a circuit region electrically connected to the fuse structure, a conductive via disposed over the second surface of the semiconductor substrate; and a conductive layer disposed over the conductive via, wherein the fuse structure comprises a first fuse element, a second fuse element, and a fuse medium connecting the first fuse element and the second fuse element, and wherein the first fuse element, the second fuse element, and the fuse medium are arranged along a first direction from the first surface toward the second surface of the semiconductor substrate;

wherein the circuit region is electrically connected to the fuse structure through the conductive via and the conductive layer;

wherein the fuse medium is located at an elevation substantially the same as that of the conductive via.

2. The semiconductor device structure of claim 1, wherein the first fuse element has a first surface exposed by the first surface of the semiconductor substrate.

3. The semiconductor device structure of claim 2, wherein the first fuse element has a second surface, opposite to the first surface, exposed by the second surface of the semiconductor substrate.

4. The semiconductor device structure of claim 2, wherein the second fuse element is disposed within the semiconductor substrate.

5. The semiconductor device structure of claim 4, wherein the second fuse element has a surface exposed by the second surface of the semiconductor substrate.

6. The semiconductor device structure of claim 1, wherein the fuse medium is embedded within the semiconductor substrate.

7. The semiconductor device structure of claim 1, wherein the first fuse element has a first width along a second direction substantially perpendicular to the first direction, and the fuse medium has a second width less than the first width along the second direction.

8. The semiconductor device structure of claim 1, wherein the second fuse element is located at an elevation substantially the same as that of the conductive layer.

9. The semiconductor device structure of claim 8, wherein the second fuse element and the conductive layer are continuous.

10. The semiconductor device structure of claim 1, wherein the first fuse element is tapered toward the first surface of the semiconductor substrate.

11. The semiconductor device structure of claim 1, wherein the first fuse element is tapered toward the second surface of the semiconductor substrate.

12. The semiconductor device structure of claim 1, wherein the second fuse element is tapered toward the first surface of the semiconductor substrate.

* * * * *